US012777689B2

(12) United States Patent
Mukesh et al.

(10) Patent No.: US 12,777,689 B2
(45) Date of Patent: Oct. 27, 2026

(54) NANOSHEET DEVICE WITH NITRIDE ISOLATION STRUCTURES

(71) Applicant: International Business Machines Corporation, Armonk, NY (US)

(72) Inventors: Sagarika Mukesh, Albany, NY (US); Alexander Reznicek, Troy, NY (US); Tsung-Sheng Kang, Ballston Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 326 days.

(21) Appl. No.: 18/147,525

(22) Filed: Dec. 28, 2022

(65) Prior Publication Data

US 2024/0222426 A1 Jul. 4, 2024

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/85*** | (2025.01) |
| ***H10D 64/01*** | (2025.01) |

(Continued)

(52) U.S. Cl.

CPC ......... *H10D 62/115* (2025.01); *H10D 30/014* (2025.01); *H10D 30/43* (2025.01); *H10D 30/6735* (2025.01); *H10D 30/6757* (2025.01); *H10D 62/121* (2025.01); *H10D 62/8503* (2025.01); *H10D 64/021* (2025.01); *H10D 84/0128* (2025.01); *H10D 84/0151* (2025.01); *H10D 84/038* (2025.01)

(58) Field of Classification Search

CPC . H10D 30/6735; H10D 62/115; H10D 30/014

See application file for complete search history.

(56) References Cited

U.S. PATENT DOCUMENTS

| | | | |
|---|---|---|---|
| 6,350,661 | B2 | 2/2002 | Lim et al. |
| 7,015,086 | B2 | 3/2006 | Chang et al. |
| 8,461,661 | B2 | 6/2013 | Hoilien |

(Continued)

FOREIGN PATENT DOCUMENTS

| | | |
|---|---|---|
| KR | 20050012945 A | 2/2005 |

OTHER PUBLICATIONS

Maiti, et al., "Modeling of Strain-Engineered Nanoscale MOSFETs," In 4th Int. Conf. Nanotechnol. Health Care Appl. (NateHCA-07,) Jul. 2007, pp. D41-D45.

*Primary Examiner* — Steven M Page

(74) *Attorney, Agent, or Firm* — Amin, Turocy & Watson, LLP

(57) ABSTRACT

One or more embodiments includes a semiconductor device. The semiconductor device includes: a first Gate-All-Around (GAA) field-effect transistor (FET) disposed on a silicon layer; and a second GAA FET disposed on the silicon layer adjacent to the first GAA FET. The semiconductor device also includes: an isolation layer disposed within the silicon layer between a first bottom dielectric isolation (BDI) layer of the first GAA FET and a second BDI layer of the second GAA FET; and a gate structure disposed proximate the first GAA FET and the second GAA FET, wherein at least one of a cap or a sidewall spacer isolates the gate structure from the silicon layer.

14 Claims, 16 Drawing Sheets

(51) Int. Cl.
*H10D 84/01* (2026.01)
*H10D 84/03* (2025.01)

(56) References Cited

U.S. PATENT DOCUMENTS

| | | | | |
|---|---|---|---|---|
| 8,530,327 | B2 | 9/2013 | Piper et al. | |
| 10,263,100 | B1 * | 4/2019 | Bi | H10D 30/024 |
| 10,332,803 | B1 * | 6/2019 | Xie | H10D 84/0167 |
| 11,101,369 | B2 | 8/2021 | Zhou | |
| 11,170,992 | B2 | 11/2021 | Tapily et al. | |
| 11,282,961 | B2 | 3/2022 | Frougier et al. | |
| 11,393,689 | B2 | 7/2022 | Posseme et al. | |
| 2020/0273753 | A1 | 8/2020 | Loubet et al. | |
| 2020/0365584 | A1 * | 11/2020 | Ando | H10D 30/6735 |
| 2021/0202327 | A1 * | 7/2021 | Wang | H10D 84/0177 |
| 2021/0217654 | A1 * | 7/2021 | Xie | H10D 64/017 |
| 2022/0254623 | A1 * | 8/2022 | Chiang | H10D 30/6757 |
| 2022/0352035 | A1 * | 11/2022 | Wang | H10D 62/121 |
| 2022/0406888 | A1 * | 12/2022 | Lee | H10D 62/112 |

* cited by examiner

Y-CUT

Y-CUT

Y-CUT

Y-CUT

NANOSHEET DEVICE WITH NITRIDE ISOLATION STRUCTURES

BACKGROUND

One or more embodiments described herein relate generally to optimizing nanosheet/semiconductor devices with respect to the limiting electrical contact between undesired locations and/or components. Embodiments relate to the nanosheet/semiconductor device including at least one of a cap or a sidewall spacer to limit electrical coupling between a gate structure of the semiconductor and a first Gate-All-Around (GAA) Field-Effect Transistor (FET), a second GAA FET, and a silicon layer.

SUMMARY

The following presents a summary to provide a basic understanding of one or more embodiments described herein. This summary is not intended to identify key or critical elements or delineate any scope of the particular embodiments or any scope of the claims. The sole purpose of the summary is to present concepts in a simplified form as a prelude to the more detailed description that is presented later. In one or more embodiments described herein, systems, devices, and/or methods, that facilitate isolating one or more regions of a nanosheet from unintended electrical connection are described.

According to an embodiment, a semiconductor device can comprise a first GAA FET disposed on a silicon layer. The semiconductor device can include a second GAA FET disposed on a silicon layer. The semiconductor device can include an isolation layer disposed within the silicon layer between a first bottom dielectric isolation (BDI) layer of the first GAA FET and a second BDI layer of the second GAA FET. The semiconductor device can include a gate structure disposed proximate the first GAA FET and the second GAA FET, wherein at least one of a cap or a sidewall spacer isolates the gate structure from the silicon layer.

According to an embodiment, a method can comprise depositing, by a fabrication system, a nitride-based dielectric liner on a patterned nanosheet coupled to a first GAA FET and a second GAA FET. The method can include filling, by the fabrication system, the patterned silicon nanosheet with a first oxide layer to be in contact with the nitride-based dielectric liner. Additionally, the method can comprise recessing, by the fabrication system, the first oxide layer to be vertically aligned with a first BDI layer of the first GAA FET and a second BDI layer of the second GAA FET. The method can comprise recessing, by the fabrication system, the nitride-based dielectric liner from contacting the first GAA FET and the second GAA FET. Further, the method can comprise depositing, by the fabrication system, a second oxide layer. The method can comprise depositing, by the fabrication system, a cap between the first GAA FET and the second GAA FET to isolate a gate structure of the first GAA FET and the second GAA FET from contacting the patterned silicon nanosheet.

According to yet another embodiment, a method for fabricating a semiconductor device can comprise disposing, by the fabrication system, a dielectric layer on a patterned nanosheet comprising a GAA FET and a silicon base layer. The method can further comprise recessing, by the fabrication system, a silicon layer of the GAA FET in a lateral direction and disposing a first portion of a sidewall spacer therein. Additionally, the method can comprise recessing, by the fabrication system, the silicon base layer and disposing an isolation layer therein. The method can comprise recessing, by the fabrication system, the silicon base layer in the lateral direction and disposing a second portion of the sidewall spacer therein.

Further, the method can comprise etching, by the fabrication system, the first portion and the second portion of the sidewall spacer to form a continuous vertical surface with the GAA FET. The method can also comprise removing, by the fabrication system, the first portion and the second portion of the sidewall spacer in a source/drain region and the oxide layer in the source/drain region proximate the isolation layer. The method can comprise removing, by the fabrication system, a second silicon layer of the GAA FET. Additionally, the method can comprise depositing, by the fabrication system, a BDI layer via Atomic Layer Deposition (ALD), wherein the first portion and the second portion of the sidewall spacer limit electrical contact between a gate structure of the GAA FET and the silicon base layer.

DETAILED DESCRIPTION

Figure 1:
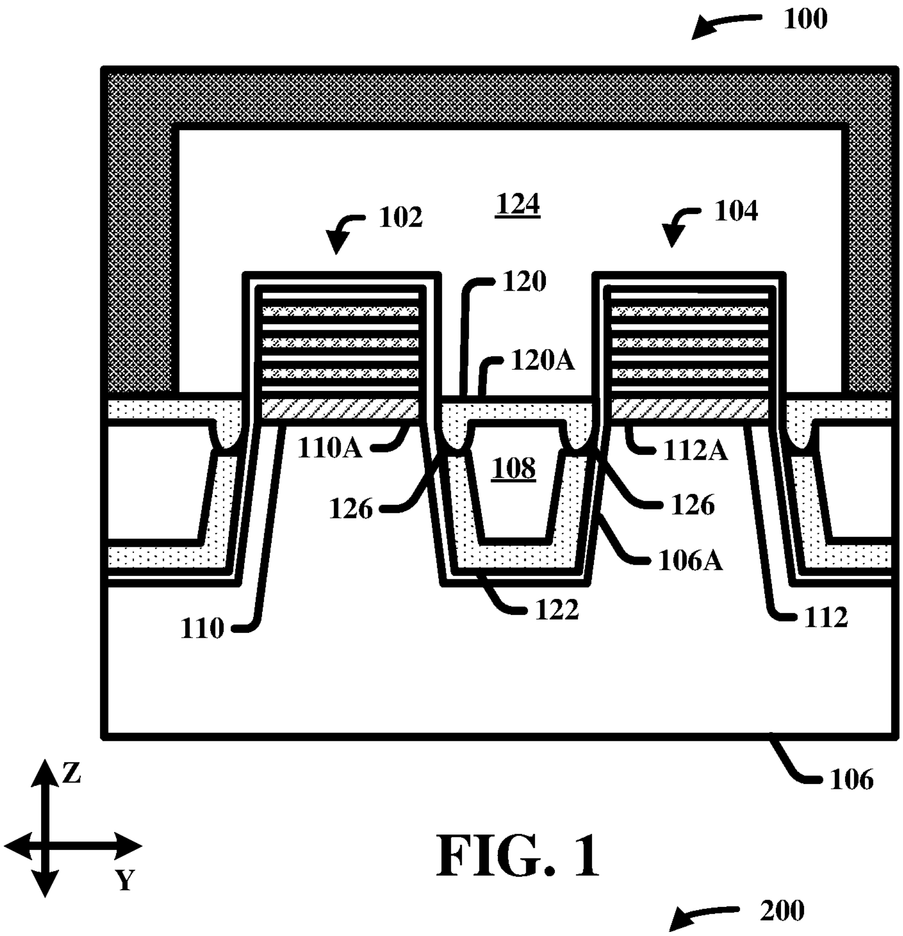
FIG. 1 illustrates a cross-sectional view of an example, non-limiting semiconductor device comprising a cap to limit contact between a gate structure of the semiconductor device and the silicon layer, in accordance with one or more embodiments described herein.

The following detailed description is merely illustrative and is not intended to limit embodiments or application or uses of embodiments. Furthermore, there is no intention to be bound by any expressed or implied information presented in the preceding Background or Summary sections, or in this Detailed Description section.

Discussion is provided herein relative to configuration, including fabrication, of an electronic structure that can comprise and/or be comprised by a controller, payload and/or other chip-based structure. As there are many uses for devices comprising silicon chips, the discussion herein need not apply solely to computer electronics, but can also apply to many other control, radio, radar, cryogenic and/or signal-based applications, among others.

It some cases, it can be desirable to isolate electrical connections between various electrical components of a semiconductor device from one or more of a variety of interferences. One or more various electrical components can include, and are not limited to, field-effect transistors (FET), metal-oxide-semiconductor (MOS) FETs, Gate-All-Around (GAA) FETs, and complementary MOS (CMOS) devices. Further, semiconductor devices can include one or more n-type an p-type transistors (nFET and pFET) that can be used to fabricate logic and other circuitry. One or more nFET and/or pFET can include source and drain regions which can be formed on either side of a channel, as the gate structure (e.g., logic gate) can be formed above and around the channel. Additionally, GAA FETs can include one or more nanosheet stacks. As used herein, a "nanosheet" stack refers to layers of nanosheets (e.g., silicon). The nanosheet stacks can include alternating layers of nanosheets and sacrificial nanosheets in early stages of assembly/manufacture. In subsequent stages of assembly/manufacture, the sacrificial nanosheets can be removed and replaced with the gate structure. In examples, the gate structure can be a high-k material (e.g., a material or compound comprising Hafnium Oxide, Lanthanum Oxide, etc.).

There is an increasing demand for high performance in semiconductor devices which includes reducing the size of semiconductor devices, including connected nanosheet transistors. Such scaling of electrical systems and components can lead to a desire for smaller electrical components and associated connection structures to the nanosheet transistors. For smaller electrical components, such as Nanosheet nFET's and pFET's, it can be difficult to form Shallow Trench Isolation (STI) layers or regions in the nanosheet. Forming such regions can result in gate structures of the nFET's and pFET's inadvertently recessed below the semiconductor device (e.g., a bottom dielectric isolation (BDI) layer of the nFET's and/or pFET's). Fabrication variances and process variances can result in the gate structure being disposed below the BDI layer of the respective nFET and/or pFET, which can cause the nFET or pFET to be in undesirable close contact with the silicon substrate. An over-etch of the STI region can expose the replacement metal gate (RMG) structure to unintended electrical connections.

The term "high-k," as used herein, refers to a material having a relatively high dielectric constant (k) as compared to that of $SiO_2$, such as, for example, Hafnium Oxide ($HfO_2$). Metal gates comprise metals such as Titanium nitride (TiN), Titanium carbide (TIC), Titanium aluminide (TiAl), Titanium Aluminum Carbide (TiAlC), etc., and conductive metal fills, such as Tungsten (W). S/D regions can be formed from in-situ doped epitaxial materials such as epitaxial Silicon, epitaxial SiGe alloy, etc., and the doping type can be either n-type or p-type depending on the device polarity.

Over-etching the STI region in the assembly/manufacture of the semiconductor device can cause a capacitor to form (unintentionally). For example, a capacitor can be formed via three layers, whereby the first layer can be the silicon substrate, the second layer (middle layer) can be a high-k dielectric liner, and the third layer can be the metal disposed within the STI region. Unintended capacitance can detrimentally interfere with electrical device performance, and it can be desired to reduce/avoid/eliminate such capacitive interference.

Additionally or alternatively, a leakage current can flow to form a short between the gate metal/structure and the silicon substrate. An inadvertently recessed STI region in the gate region can expose the silicon substrate (e.g., a sidewall thereof) to physical interferences. Moreover, the roughness of the interface between the gate structure/metal and the patterned silicon nanosheet can form a metal to silicon short due to the geometrical effects of the contact profile. A hole can be formed in the gate dielectric due to electrical breakthrough; forming a short between the gate metal and the silicon substrate. One or more layers can be added to the semiconductor device to limit contact between the gate metal of the transistor and the silicon substrate layer when the STI region is disposed below the BDI layer of the respective transistor.

It should also be understood that when an element such as Silicon layer, etc. is referred to as being "on" or "over" another element, it can be directly on the other element or intervening elements can also be present. In contrast, when an element is referred to as being "directly on" or "directly over" another element, there are no intervening elements present. It should also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Additional description of functionalities will be further described below with reference to the example embodiments of FIGS. 1, where repetitive description of like elements and/or processes employed in respective embodiments is omitted for sake of brevity. The semiconductor device 100 can comprise a first GAA FET (e.g., nanosheet) 102 and a second GAA FET (e.g., nanosheet) 104 that can be disposed on a silicon layer 106 (e.g., a nanosheet layer). The first GAA FET 102 can be disposed substantially adjacent to the second GAA FET 104. The first GAA FET 102 and the second GAA FET 104 can include one or more internal layers including a variety of materials such as silicon (Si), silicon-germanium alloy (SiGe). The first GAA FET 102 and the second GAA FET 104 can include sacrificial layers consisting of SiGe layers ranging from SiGe 20% to SiGe 35%, as well as 50-60% SiGe for the sacrificial bottom layer (e.g., the BDI layer formed later in the manufacturing process). The notation "SiGe 20%" can be used to indicate that 20% of the material in the SiGe alloy is Germanium.

With embodiments, the semiconductor device 100 can include an isolation layer/region 108 disposed within the silicon layer 106 between (e.g., laterally) the first GAA FET 102 and the second GAA FET 104. Further, a top of the isolation layer 108 can be disposed below (e.g., vertically below) a first bottom dielectric isolation (BDI) layer 110 of the first GAA FET 102 and can also be disposed below a second BDI layer 112 of the second GAA FET 104. Additionally or alternatively, the top of the isolation layer 108 can be disposed between the silicon layer 106, the first BDI layer 110, and the second BDI layer 112. The first BDI layer 110 and the second BDI layer 112 can include one or more of a variety of dielectric materials. The isolation layer 108 can provide isolation between a gate structure 124 of the semiconductor device 100 and the silicon layer 106; however, if the isolation layer 108 is disposed below the first BDI layer 110 and the second BDI layer 112, a cap 120 (e.g., a protective layer) can limit unintended contacts between a high-k metal gate (HKMG) structure 124 of the semiconductor device 100 with the silicon layer 106 due to overetching of the isolation layer 108.

The isolation layer 108 can isolate the gate structure 124 of the semiconductor device 100 from contacting the first BDI layer (region) 110 and the second BDI layer (region) 112 via the cap 120. Further, the cap 120 can limit contact between the HKMG structure 124 and silicon layer 106. The cap 120 can include one or more of a variety of dielectric Nitride-based materials (e.g., SiN, SiBCN, SiOCN, SiBN, SiCN, SiC, SiON, and SiOC).

In embodiments, FIG. 1 illustrates a cross-sectional view of an example, non-limiting semiconductor device 100 that can address the challenges of excess STI etching resulting in the HKMG structure 124 of the semiconductor device 100 extending below the first BDI layer 110 and/or the second BDI layer 112. Further, the cap 120 can limit electrical contact between the HKMG structure 124, the first BDI layer 110, and the second BDI layer 112. The cap 120 can include one or more of a variety of shapes, sizes, and/or configurations. For example and without limitation, the cap 120 can be substantially rectangular, curved, and oblong shaped. The cap 120 can include a variable width where a middle portion of the cap 120 can include a smaller width (e.g., in the Z-direction) than a width at the ends of the cap 120 (e.g., ends in the Y-direction). The cap 120 can be formed as a cap/top/seal for a nitride-based dielectric liner 122 of the semiconductor device 100. Further, the cap 120 can be a cap/top/seal for the isolation layer 108 partially enclosed by the nitride-based dielectric liner 122. The cap 120 and the nitride-based dielectric liner 122 can surround an exterior of the isolation layer 108 to limit over-etching. The nitride-based dielectric liner 122 can be formed along a top surface 106A (e.g., outer surface) of the silicon layer 106 (e.g., whereby a general U-shape can be formed in an existing recess of the silicon layer 106). The nitride-based dielectric liner 122 can form a similar shape as the profile of the silicon layer 106. For example and without limitation, for profiles including rectangular recesses, the nitride-based dielectric liner 122 can be partially rectangular shaped, and for profiles including curved recesses, the nitride-based dielectric liner 122 can be partially rounded or curved.

With embodiments, as further illustrated in FIG. 1, a first surface 120A (e.g., a top surface) of the cap 120 can be disposed above a first surface 110A (e.g., a bottom surface) of the first BDI layer 110 and a second surface 112A (e.g., a bottom surface) of the second BDI layer 112. The cap 120 can be in contact with the HKMG structure 124 corresponding with the first GAA FET 102 and the second GAA FET 104. Further, the cap 120 can limit (e.g., reduce and/or prevent) the gate metal of the HKMG structure 124 from contacting the silicon layer 106 of the semiconductor device 100 (and additionally or alternatively the first BDI layer 110 and the second BDI layer 112). Such contact between the silicon layer 106 and the HKMG structure 124 can cause degraded semiconductor device 100 performance due to gate to substrate shorts.

In embodiments, the isolation layer 108 can be a multilayer STI fill with a bulk oxide fill. Further, as shown in FIG. 1, the semiconductor device 100 can include an oxide layer 126 disposed between the cap 120 and the nitride-based dielectric liner 122. The oxide layer 126 can be disposed vertically between (e.g., in the Z-direction) the cap 120 and the nitride-based dielectric liner 122. The oxide layer 126 can be a thin layer comprising a variety of oxide that can include a width (e.g., in the Z-direction) less than a width of the cap 120 and/or the nitride-based dielectric liner 122.

Figure 2:
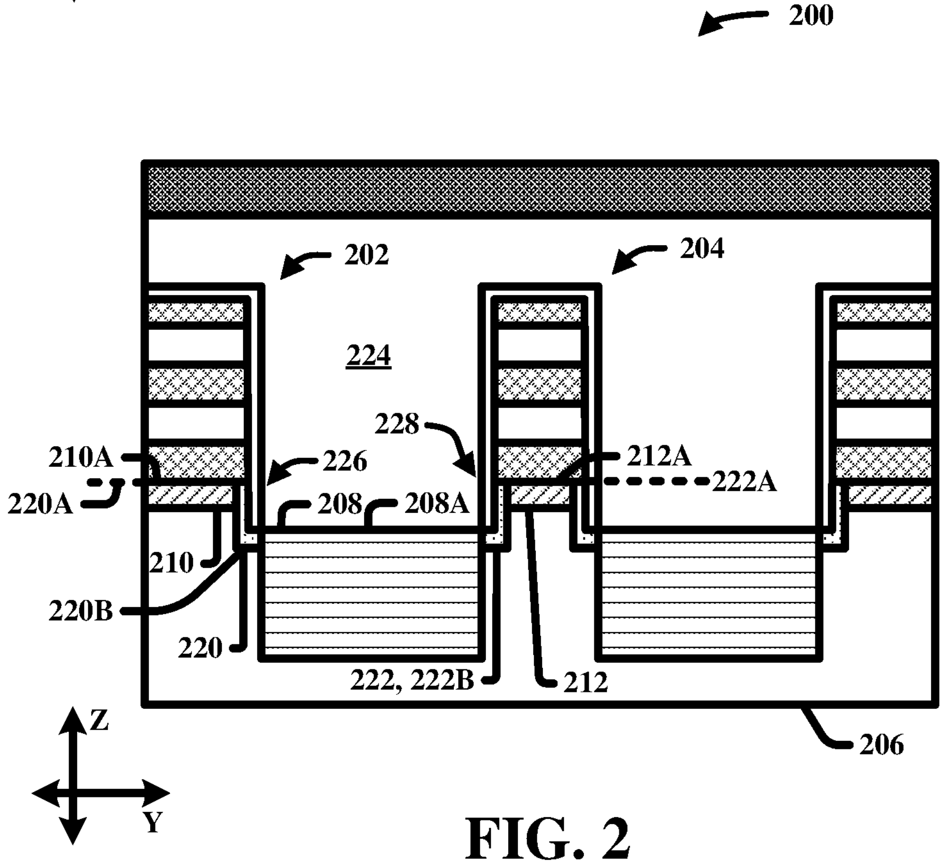
FIG. 2 illustrates a cross-sectional view of another example, non-limiting semiconductor device comprising a sidewall spacer to limit contact between a gate structure of the semiconductor device and the silicon layer, in accordance with one or more embodiments described herein.
Figure 3:
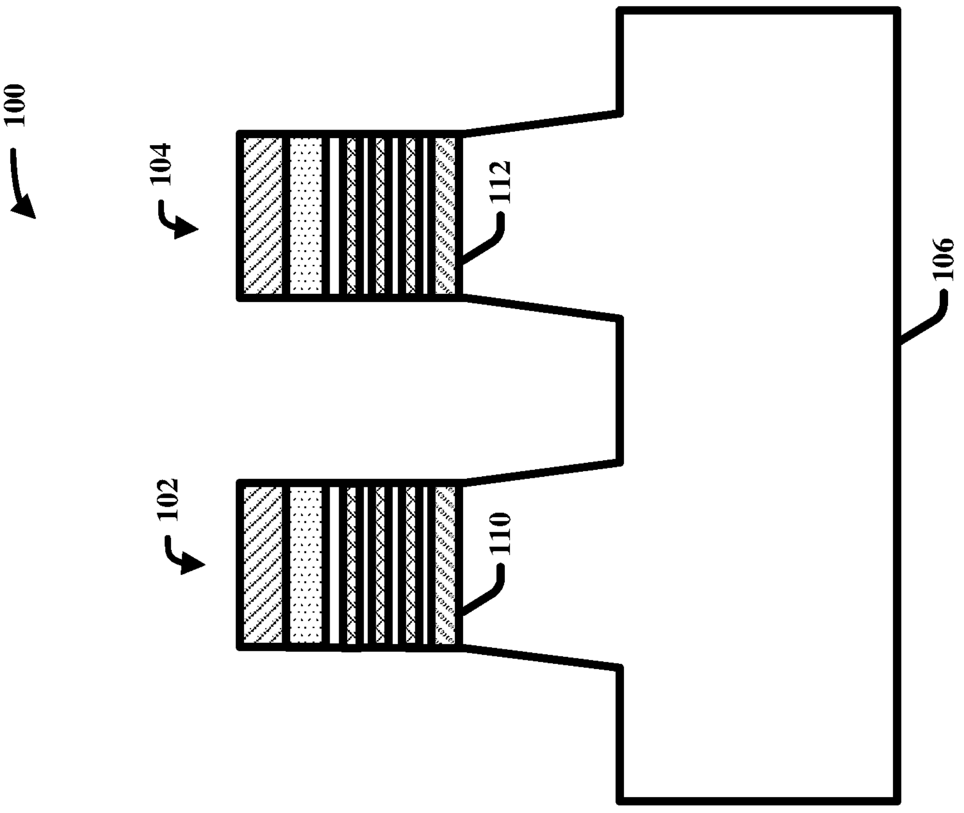
FIG. 3 illustrates a cross-sectional view of an example, non-limiting semiconductor device comprising a first BDI layer and a second BDI layer, in accordance with one or more embodiments described herein.

In embodiments, FIG. 2 illustrates a cross-sectional view of an example, non-limiting semiconductor device 200 that can address the challenges of excess STI etching resulting in one or more gates of the semiconductor device 200 extending below a first BDI layer 210 or a second BDI layer 212. Additional description of functionalities will be further described below with reference to the example embodiments of FIGS. 2, where repetitive description of like elements and/or processes employed in respective embodiments is omitted for sake of brevity. Further, the semiconductor device 200 can include a first sidewall spacer 220 and a second sidewall spacer 222 to limit electrical connection between a gate structure 224 and the first BDI layer 210, the second BDI layer 212, and a silicon layer 206 of the semiconductor device 200. The first sidewall spacer 220 and/or the second sidewall spacer 222 can include one or more of a variety of dielectric Nitride-based materials (e.g., SiN, SiBCN, SiOCN, SiBN, SiCN, SiC, SiON, and SiOC). The first sidewall spacer 220 can be disposed substantially proximate the first BDI layer 210 and the second sidewall spacer 222 can be disposed substantially proximate the second BDI layer 212. The first sidewall spacer 220 can be disposed at substantially the same height as the second sidewall spacer 222 (e.g., in the Z-direction). The isolation layer 208 (e.g., STI region) of the semiconductor device 200 can be disposed between (e.g., in the Y-direction) the first sidewall spacer 220 and the second sidewall spacer 222. The first sidewall spacer 220 and the second sidewall spacer 222 can be disposed at least partially within one or more sidewalls of the silicon layer 206. For example and without limitation, the silicon layer 206 can include a first sidewall 226 and a second sidewall 228. The first sidewall 226 can be associated with the first BDI layer 210 and the second sidewall 228 can be associated with the second BDI layer 212. The first sidewall spacer 220 can be at least partially disposed (e.g., in some cases entirely disposed) within the first sidewall 226, and the second sidewall spacer 222 can be at least partially disposed (e.g., in some cases entirely disposed) within the second sidewall 228.

With embodiments, the first sidewall spacer 220 and the second sidewall spacer 222 can include one or more of a variety of shapes, sizes, and/or configurations. The first sidewall spacer 220 and the second sidewall spacer 222 can be substantially rectangular, L-shaped, and/or curved. Further, the shape of the first sidewall spacer 220 and the second sidewall spacer 222 can be determined from the shape of the recesses of the silicon layer 206 for the first sidewall spacer 220 and the second sidewall spacer 222 to be disposed at least partially within.

In embodiments, such as generally illustrated in FIG. 2, a top surface 220A of the first sidewall spacer 220 can be disposed proximate (e.g., and/or vertically aligned with) a top surface 210A of the first BDI layer 210. A top surface 222A of the second sidewall spacer 222 can be disposed proximate (e.g., and/or vertically aligned with) a top surface 212A of the second BDI layer 212. The first sidewall spacer 220 can be in contact with at least a portion of the first BDI layer 210. Similarly, the second sidewall spacer 222 can be in contact with at least a portion of the second BDI layer 212. Further, a bottom surface 220B of the first sidewall spacer 220 and a bottom surface 222B of the second sidewall spacer 222 can be disposed below a top surface 208A of the isolation layer 208. The top surface 220A of the first sidewall spacer 220 can be opposite the bottom surface 220B of the first sidewall spacer 220, and the top surface 222A of the second sidewall spacer 222 can be opposite the bottom surface 222B of the second sidewall spacer 222.

The first sidewall spacer 220 and the second sidewall spacer 222 can cover one or more gaps between the isolation layer 208, the first BDI layer 210, and the second BDI layer 212. The first sidewall spacer 220 and the second sidewall spacer 222 can connect the isolation layer 208 to the first BDI layer 210 and the second BDI layer 212. In examples, the isolation layer 208 can be a multilayer STI fill with a bulk oxide fill.

With embodiments, FIGS. 3-12 and 25 illustrate a method 300 of fabricating the semiconductor device 100 by a fabrication system such that the cap 120 (and the nitride-based dielectric liner 122) can limit contact between the HKMG structure 124 and the silicon layer 206. The method 300 can comprise providing a silicon layer 106 whereby nanosheet patterning can be conducted providing a first BDI layer 110 (e.g., a first GAA FET 102) and a second BDI layer 112 (e.g., a second GAA FET); and the fabrication system can deposit a second oxide layer 130 over the top surface 106A (e.g., outer surface) of the silicon layer 106 with nanosheet patterning (step 302). Additionally, turning to FIG. 4, the fabrication system can deposit the nitride-based dielectric liner 122 (e.g., STI liner layer) on a top surface 130A of the second oxide layer 130 (step 304). Further, the method 300 can include a high-density plasma oxide fill 108' (e.g., of the isolation layer 108) of the semiconductor device 100 (step 306) on a surface of the nitride-based dielectric liner 122. Such high-density plasma oxide fill 108' can fill the isolation layer 108 residing below the first BDI layer 110 and the second BDI layer 112.

Figure 4:
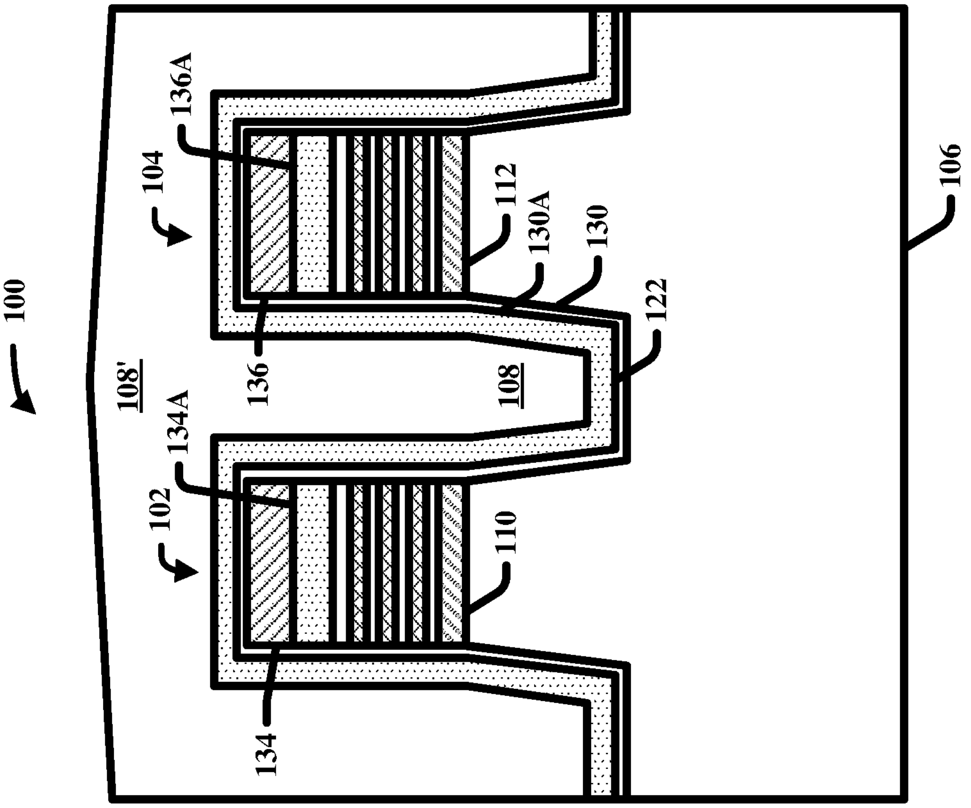
FIG. 4 illustrates a cross-sectional view of an example, non-limiting semiconductor device comprising a nitride-based dielectric liner, in accordance with one or more embodiments described herein.
Figure 5:
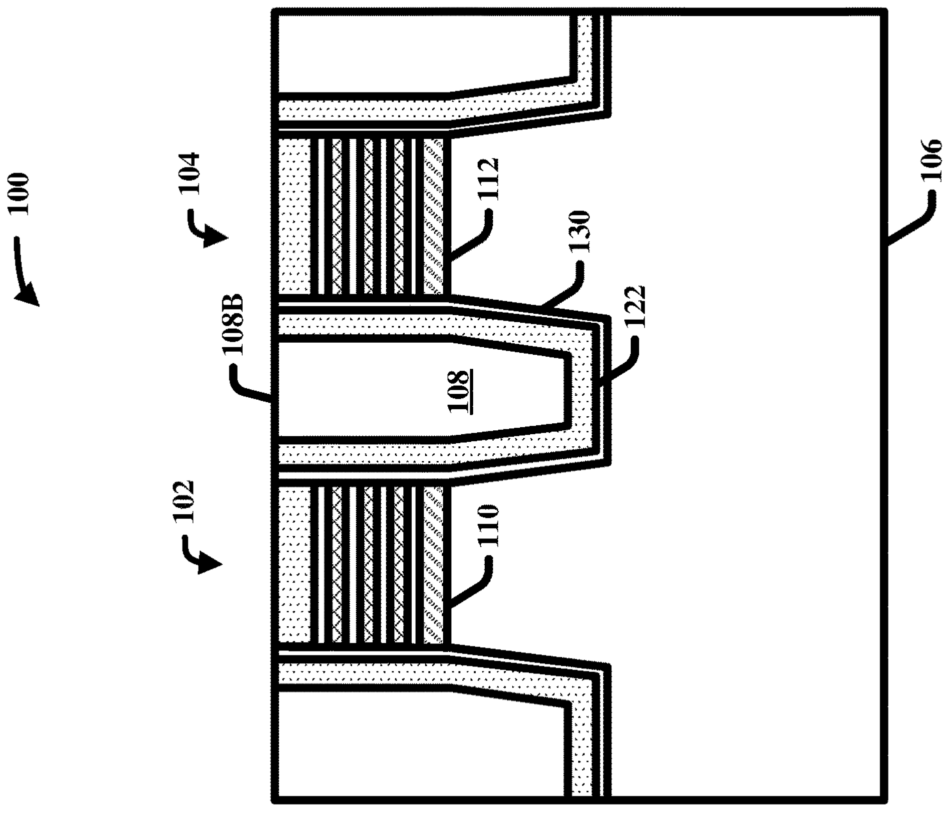
FIG. 5 illustrates a cross-sectional view of an example, non-limiting semiconductor device comprising the step of recessing a high-density plasma oxide fill region, in accordance with one or more embodiments described herein.

In examples, such as shown in FIG. 5, the method 300 of fabricating the semiconductor device 100 by the fabrication system can comprise recessing the high-density plasma oxide fill. Further, the method 300 can include removing a first hard mask portion 134 (e.g., as shown in FIG. 4) associated with the first GAA FET 102 and a second hard mask portion 136 (e.g., as shown in FIG. 4) associated with the second GAA FET 104 of the semiconductor device 100 (step 308). The fabrication system can recess the high-density plasma oxide fill such that the top surface 108B of the isolation layer 108 can be substantially parallel with a bottom 134A of the first hard mask portion 134 and a bottom 136A of the second hard mask portion 136.

Figure 6:
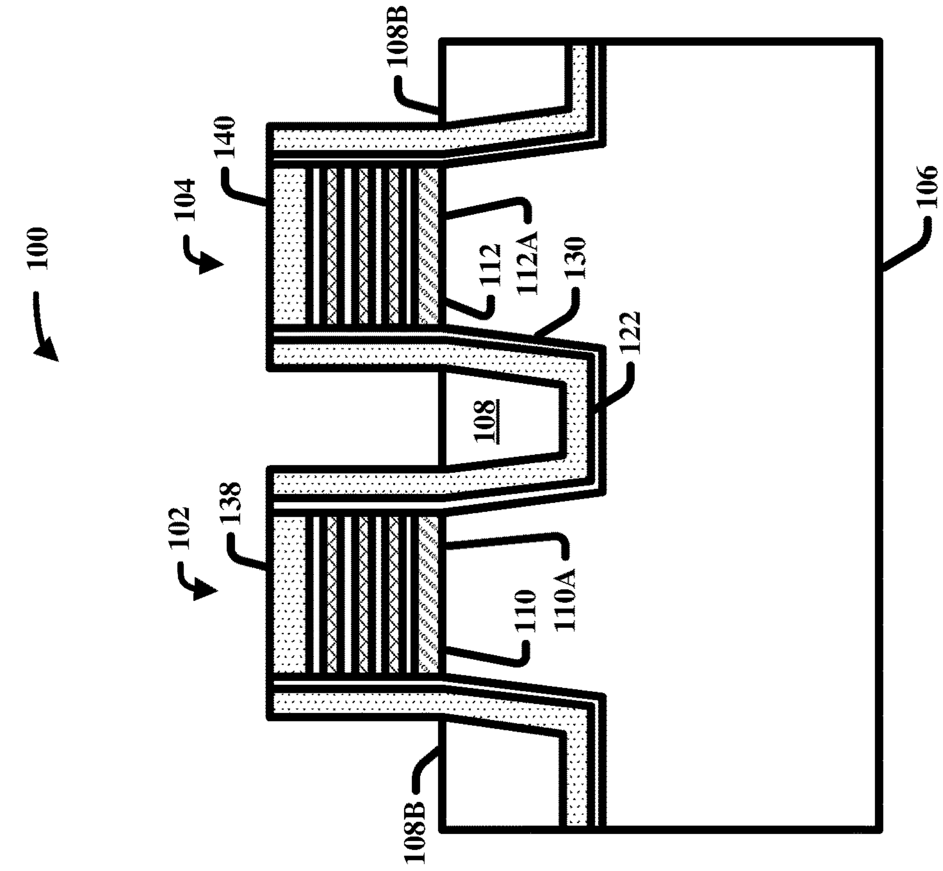
FIG. 6 illustrates a cross-sectional view of an example, non-limiting semiconductor device comprising the step of further recessing the high-density plasma oxide fill region, in accordance with one or more embodiments described herein.

With embodiments, such as shown in FIG. 6, the method 300 of fabricating the semiconductor device 100 by the fabrication system can comprise further recessing the isolation layer 108 (e.g., high-density plasma oxide fill). The fabrication system can recess the isolation layer 108 (e.g., high-density plasma oxide fill) such that a top surface 108B of the high-density plasma oxide fill can be parallel with the first surface 110A (e.g., bottom surface) of the first BDI layer 110 and the second surface 112A (e.g., bottom surface) of the second BDI layer 112. Further, the recess of the isolation layer 108 (e.g., high-density plasma oxide fill) can include a depth such that portions/segments of the nitride-based dielectric liner 122 can be exposed.

Figure 7:
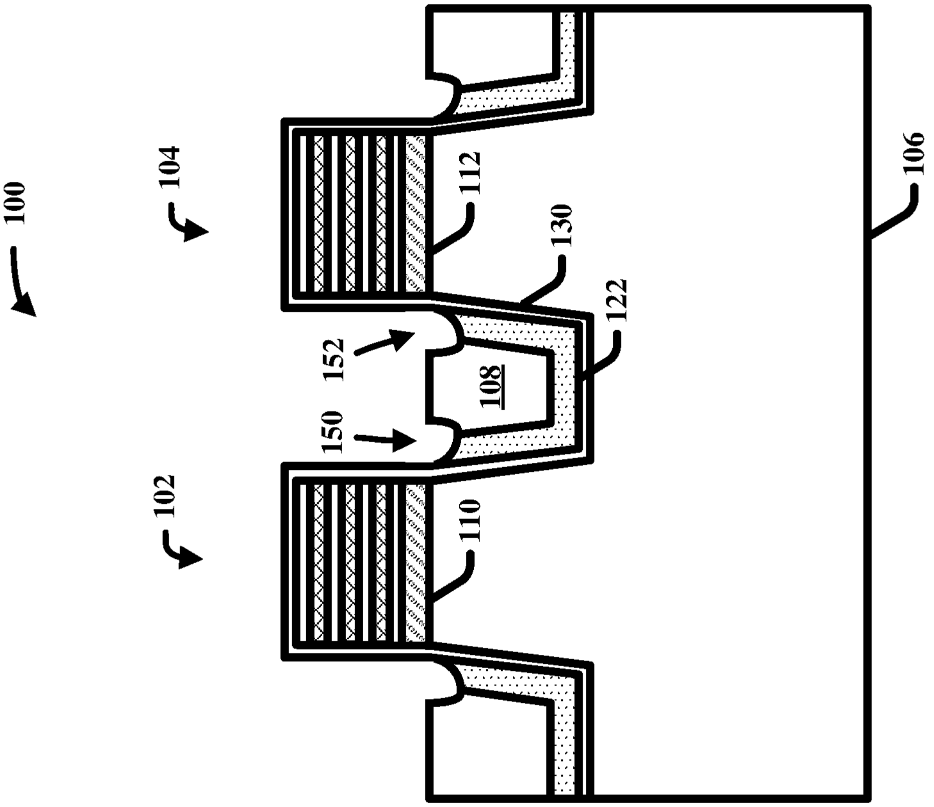
FIG. 7 illustrates a cross-sectional view of an example, non-limiting semiconductor device comprising the step of recessing the nitride-based dielectric liner, in accordance with one or more embodiments described herein.

In embodiments, such as shown in FIG. 7, the method 300 of fabricating the semiconductor device 100 by the fabrication system can comprise recessing the nitride-based dielectric liner 122 (e.g., in the Z-direction) to the first surface 110A (e.g., bottom surface) of the first BDI layer 110 and the second surface 112A (e.g., bottom surface) of the second BDI layer 112. The method 300 can include removing a first nitride-based hard mask 138 (e.g., as shown in FIG. 6) and a second nitride-based hard mask 140 (e.g., as shown in FIG. 6) of the semiconductor device 100 via etching. Additionally, the method 300 of fabricating the semiconductor device 100 by a fabrication system can include forming a first recess 150 and a second recess 152 within the nitride-based dielectric liner 122. The first recess 150 can be formed substantially proximate the first BDI layer 110 and the second recess 152 can be formed substantially proximate the second BDI layer 112. In forming the first recess 150 and the second recess 152 the fabrication system can remove portions of the nitride-based dielectric liner 122 that reside below the first BDI layer 110 and the second BDI layer 112. For example and without limitation, the first recess 150 and the second recess 152 can include one or more of a variety of shapes, sizes, and configurations. The first recess 150 and the second recess 152 can be substantially curved, rectangular, rounded, and/or oval shaped. The nitride-based dielectric liner 122 can include a profile substantially similar to the shape and size of the first recess 150 and the second recess 152.

Figure 8:
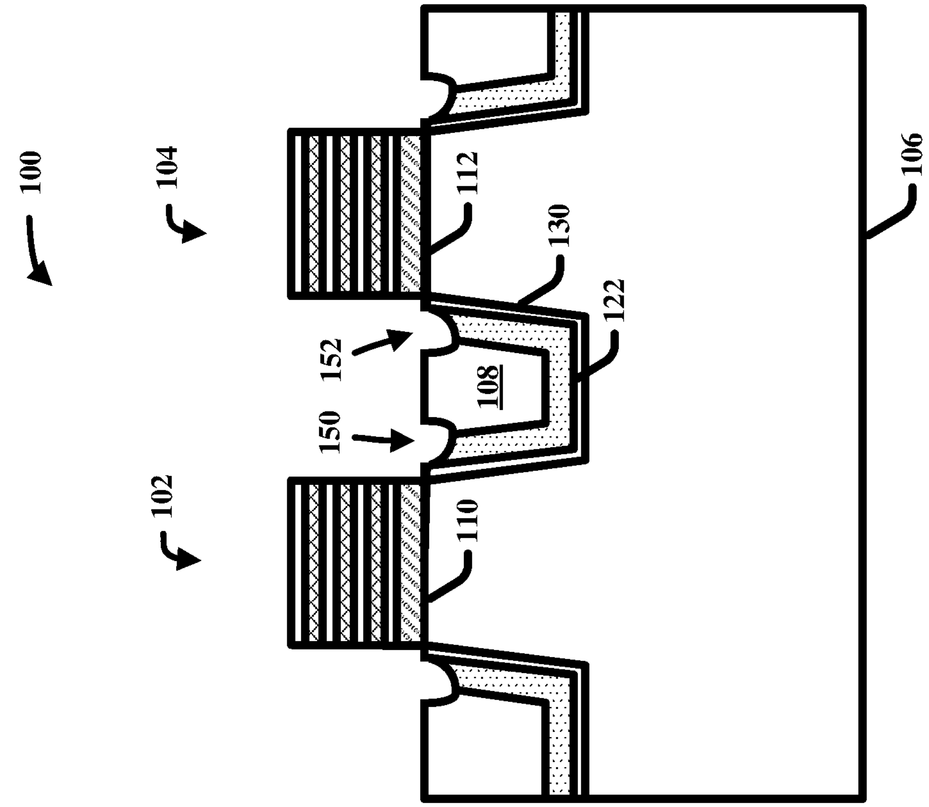
FIG. 8 illustrates a cross-sectional view of an example, non-limiting semiconductor device comprising the step of cleaning the surface of the semiconductor device, in accordance with one or more embodiments described herein.

With embodiments, such as shown in FIG. 8, the method 300 of fabricating the semiconductor device 100 by the fabrication system can comprise cleaning the surface of the semiconductor device 100 after etching (e.g., after removing the nitride-based dielectric liner 122). The fabrication system can perform one or more of a variety of semiconductor device 100 cleaning methods to prepare the semiconductor device 100 for subsequent stages of fabrication.

Figure 9:
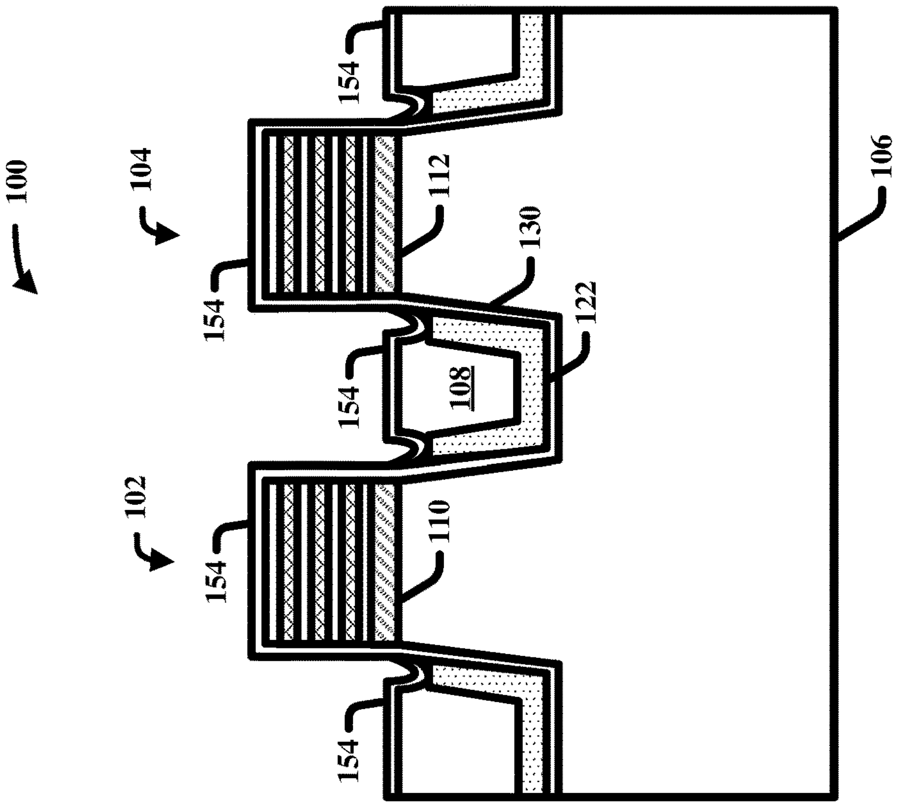
FIG. 9 illustrates a cross-sectional view of an example, non-limiting semiconductor device comprising the step of disposing an EG oxide layer, in accordance with one or more embodiments described herein.

In embodiments, such as illustrated in FIG. 9, the method 300 of fabricating the semiconductor device 100 by the fabrication system can comprise depositing at 308 an extra gate (EG) oxide layer 154 on the semiconductor device 100. Further, the method 300 can include depositing the EG oxide layer 154 at least partially within the first recess 150 and the second recess 152 to form the oxide layer 126 disposed between the cap 120 and the nitride-based dielectric liner 122 (e.g., see FIGS. 1 and 10). Additionally, the EG oxide layer 154 can be in contact with the isolation layer 108, the cap 120, and the nitride-based dielectric liner 122.

Figure 10:
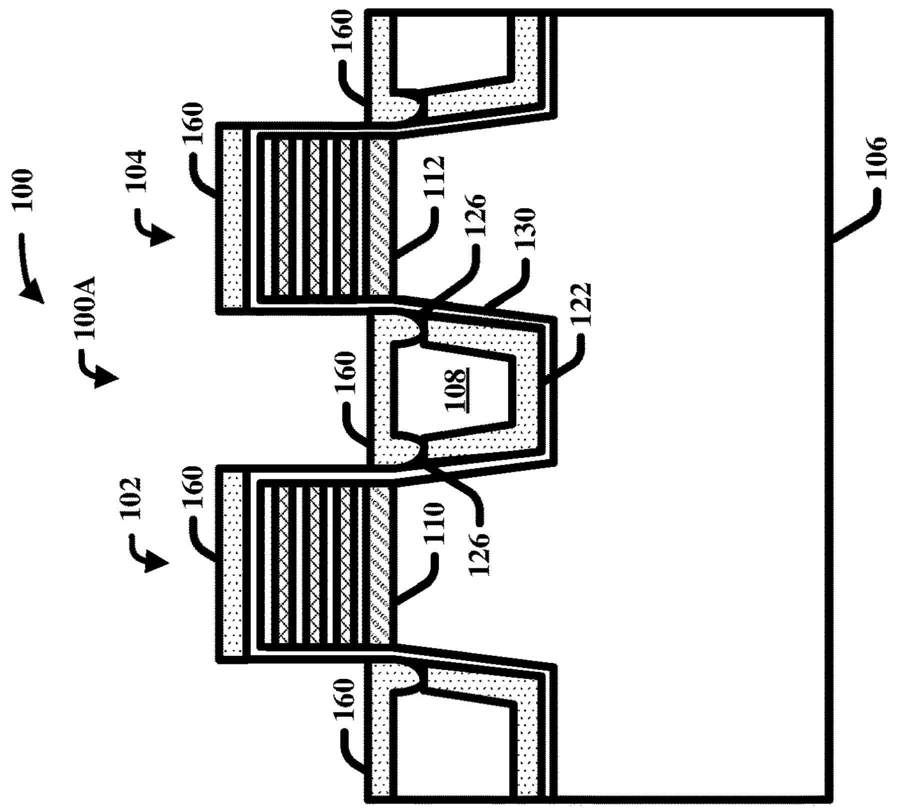
FIG. 10 illustrates a cross-sectional view of an example, non-limiting semiconductor device comprising the step of anisotropic nitride deposition, in accordance with one or more embodiments described herein.

With embodiments, such as illustrated in FIG. 10, the method 300 of fabricating the semiconductor device 100 by the fabrication system can comprise utilizing anisotropic nitride deposition (directional deposition) to form the cap 120 (step 310). The method 300 can include depositing an additional nitride-based layer 160 on a top surface 100A of the semiconductor device 100. The additional nitride-based layer 160 can be disposed above the first BDI layer 110 and the second BDI layer 112 (e.g., vertically aligned with the first GAA FET 102 and/or the second GAA FET 104). The additional nitride-based layer 160 can be disposed on top of the EG oxide layer 154 and can be disposed between the first BDI layer 110 and the second BDI layer 112. The additional nitride-based layer 160 can be deposited on the oxide layer 126 such that the oxide layer 126 can be disposed vertically between the cap 120 and the nitride-based dielectric liner 122.

Figure 11:
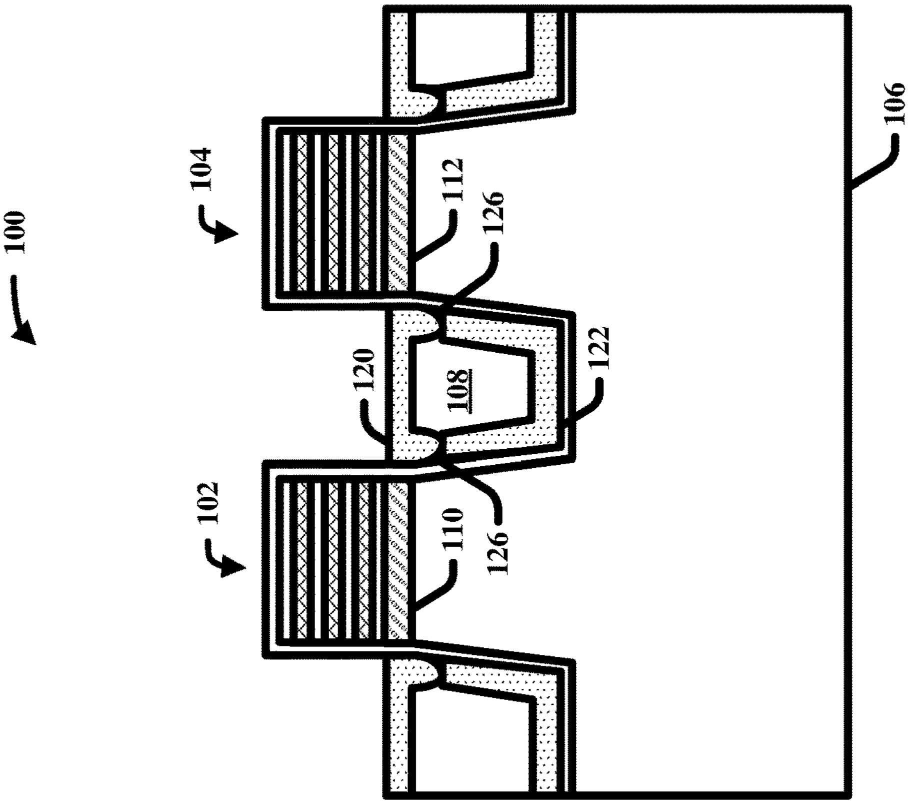
FIG. 11 illustrates a cross-sectional view of an example, non-limiting semiconductor device comprising the step of Angle RIE etching or Atomic Layer Etching and Organic Planarization Layer depositing to remove the nitride-based layer, in accordance with one or more embodiments described herein.

In embodiments, such as illustrated in FIG. 11, the method 300 of fabricating the semiconductor device 100 by the fabrication system can comprise removing, by the fabrication system, portions of the additional nitride-based layer 160 vertically aligned with the first BDI layer 110 and the second BDI layer 112 (step 312). Further, the method 300 can include removing portions of the additional nitride-based layer 160 in one or more of a variety of manners, as selected by an operator/user. For example and without limitation, the method 300 can include Angle Reactive Ion Etching (RIE) to remove portions of the additional nitride-based layer 160 (step 314). The process of Angle RIE can be a plasma etching process that uses a charge to add a directional component to the etching process. The fabrication system can selectively remove portions of the additional nitride-based layer 160 from the areas above the first BDI layer 110 and the second BDI layer 112 (e.g., vertically above in the Z-direction). Additionally, the method 300 can include removing portions of the additional nitride-based layer 160 form the sides (e.g., sidewalls) of the first GAA FET 102 and the second GAA FET 104. Further, the method 300 can include removing portions of the additional nitride-based layer 160 disposed vertically above (e.g., in the Z-direction) the first surface 120A (e.g., top surface) of the cap 120 while protecting the cap 120 from partial recessing/etching.

With embodiments, such as illustrated in FIG. 11, the method 300 of fabricating the semiconductor device 100 by the fabrication system can additionally or alternatively comprise Atomic Layer Etching, Organic Planarization Layer depositing, and recessing/etching to remove nitride to expose the EG oxide layer 154 in portions vertically above the first BDI layer 110 and the second BDI layer 112 (step 316). Further, the fabrication system can deposit the Organic Planarization Layer on the additional nitride-based layer 160 to facilitate recessing and etching to remove portions of the additional nitride-based layer 160 from the top of the EG oxide layer 154.

Figure 12:
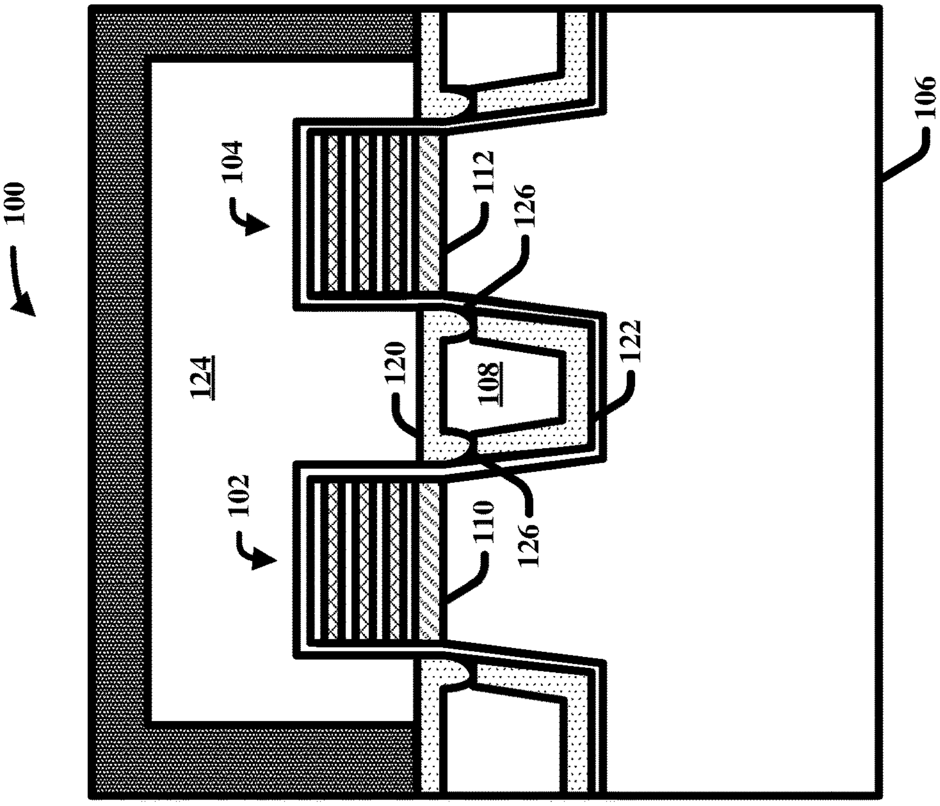
FIG. 12 illustrates a cross-sectional view of an example, non-limiting semiconductor device comprising a cap to isolate the gate structure from the first BDI layer, the second BDI layer, and the silicon layer, in accordance with one or more embodiments described herein.

In embodiments, such as illustrated in FIG. 12, the semiconductor device 100 can be formed with the HKMG structure 124 where the cap 120 can limit contact (e.g., electrical coupling) between the HKMG structure 124 and the silicon layer 106 due to over-etching. Additionally, the cap 120 can isolate the isolation layer 108 from contacting the first BDI layer 110 and the second BDI layer 112. Further, the semiconductor device 100 can be processed further to finalize manufacturing processes.

Figure 13:
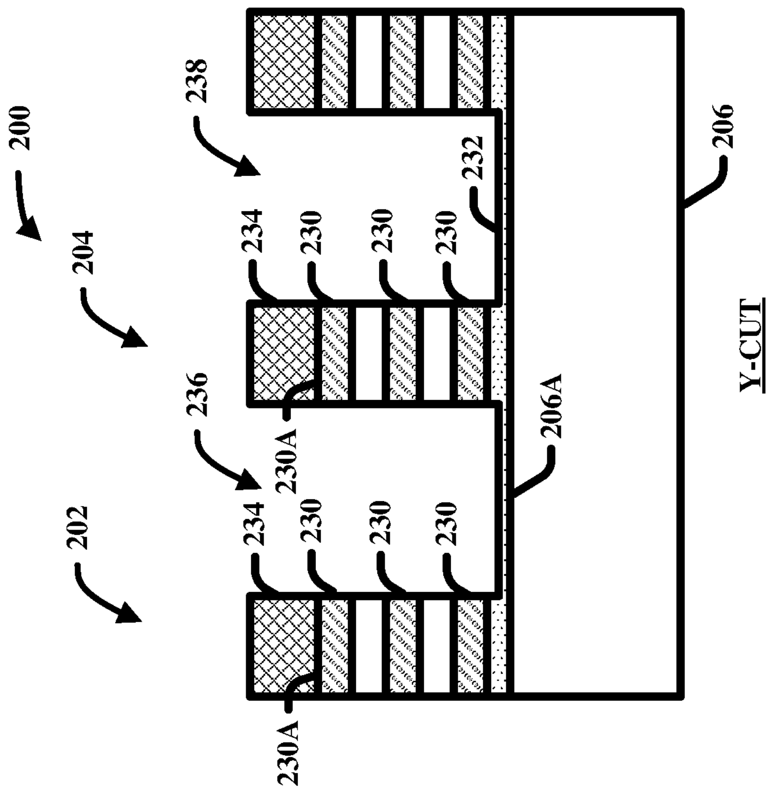
FIG. 13 illustrates a cross-sectional view of an example, non-limiting semiconductor device comprising one or more various silicon layers which form a nanosheet, in accordance with one or more embodiments described herein.

With embodiments, FIGS. 13-24C and 26 illustrate a method 400 of fabricating the semiconductor device 200 by a fabrication system such that the first sidewall spacer 220 and the second sidewall spacer 222 can limit electrical connection between the HKMG structure 124 and the first BDI layer 210, the second BDI layer 212, and the silicon layer 206. Turning to FIG. 13 (e.g., a section view along the Y-plane), the method 400 can comprise providing a silicon layer 206 whereby nanosheet patterning can be conducted (step 402). The silicon layer 206 can include one or more of a variety of layers disposed on a top surface 206A. For example and without limitation, the semiconductor device 200 can include a plurality of first silicon layers 230 and a second silicon layer 232. The plurality of first silicon layers 230 and the second silicon layer 232 can include one or more varieties of silicon materials. Further, the first silicon layers 230 can include silicon-germanium (e.g., SiGe 30); and the second silicon layer 232 can include silicon-germanium (e.g., SiGe 55). Additionally, the semiconductor device 200 can include one or more hard mask layers 234 disposed on the top surface 230A of one or more first silicon layers 230 (e.g., the first silicon layer 230 disposed at the greatest height in the Z-direction). The method 400 can comprise at least partially recessing the semiconductor device 200 via RIE to form a first recess 236 and a second recess 238 (step 404). The first recess 236 and the second recess 238 can be formed such that the first recess 236 and the second recess 238 at least partially extend into the second silicon layer 232 (e.g., vertically).

Figure 14:
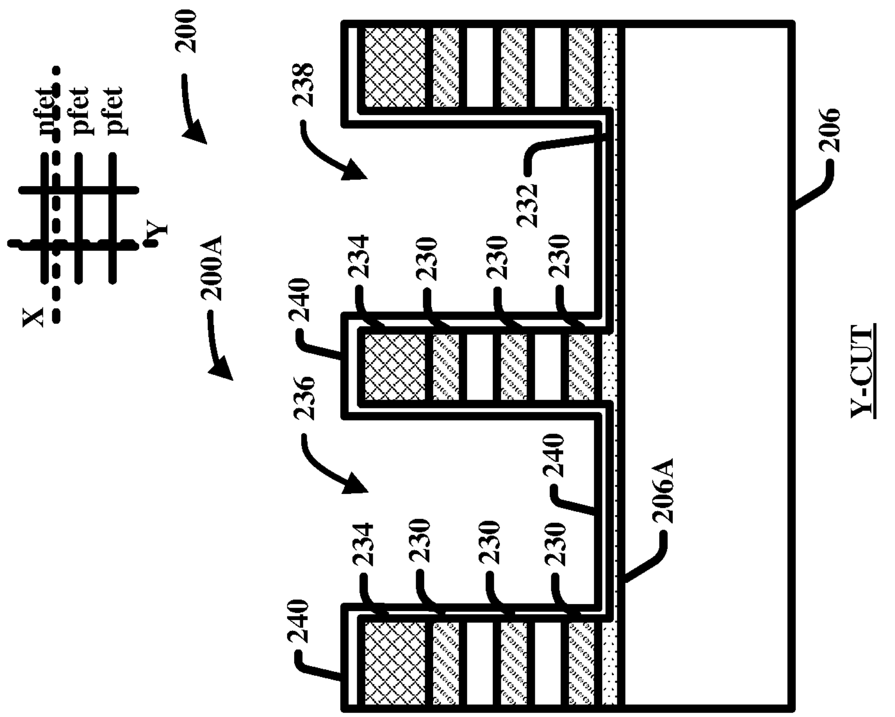
FIG. 14 illustrates a cross-sectional view of an example, non-limiting semiconductor device comprising a dielectric layer, in accordance with one or more embodiments described herein.
Figure 15:
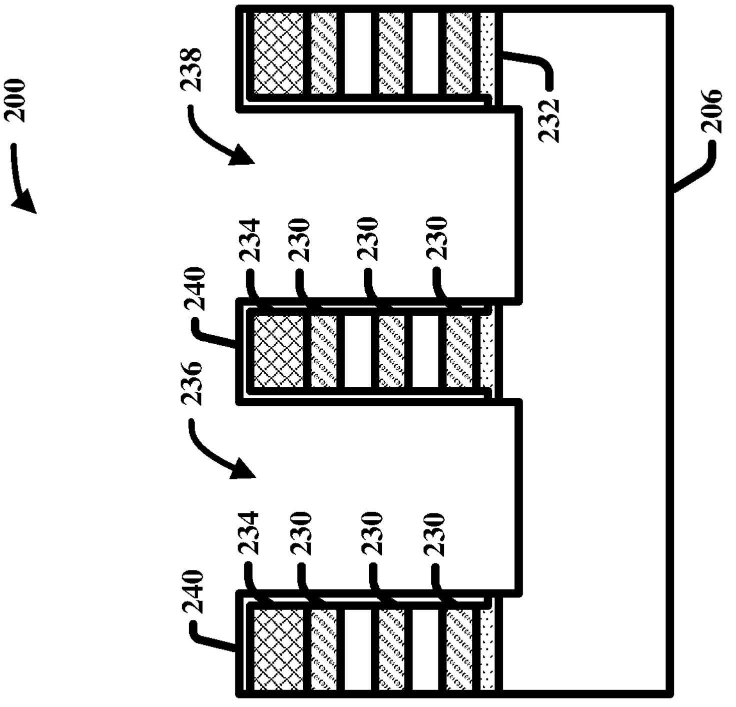
FIG. 15 illustrates a cross-sectional view of an example, non-limiting semiconductor device comprising the step of recessing the semiconductor device via RIE such that the one or more silicon layers include exposed surfaces, in accordance with one or more embodiments described herein.

In examples, such as shown in FIG. 14, the method 400 of fabricating the semiconductor device 200 by the fabrication system can comprise depositing a dielectric layer 240 via ALD processes. The method 400 can comprise disposing the dielectric layer 240 over a top surface 200A of the semiconductor device 200. Further, as shown in FIG. 15, the method 400 can comprise further recessing the first recess 236 and the second recess 238 via RIE such that the silicon layer 206 and the second silicon layer 232 include exposed surfaces. The fabrication system can extend the first recess 236 and the second recess 238 generally in the Z-direction.

Figure 16:
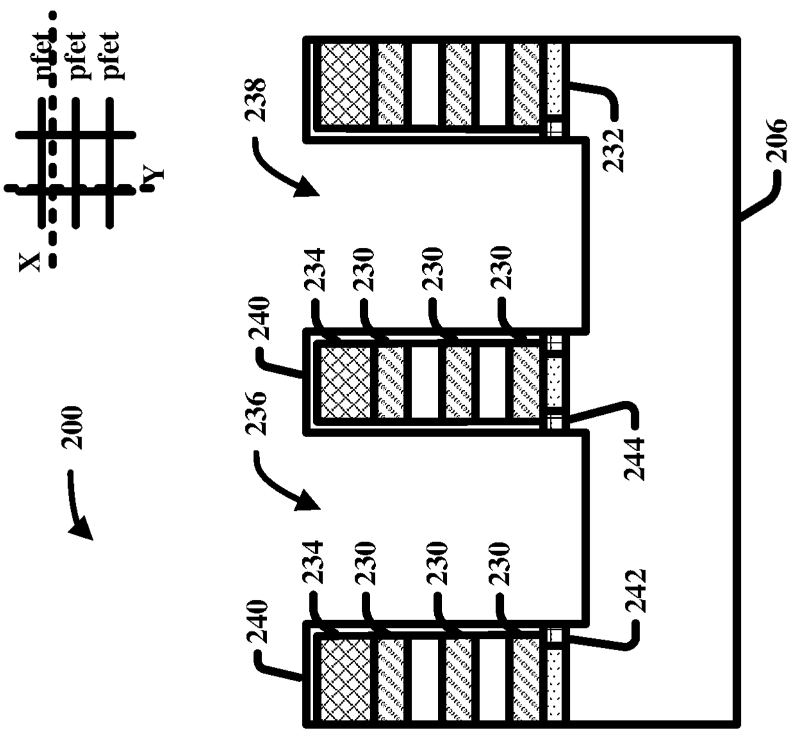
FIG. 16 illustrates a cross-sectional view of an example, non-limiting semiconductor device comprising a first inner spacer and a second inner spacer, in accordance with one or more embodiments described herein.

With embodiments, such as illustrated in FIG. 16, the method 400 of fabricating the semiconductor device 200 by the fabrication system can comprise recessing the second silicon layer 232 laterally (e.g., in the Y-direction) (step 406) and depositing a first inner spacer 242 and a second inner spacer 244 to pinch off the recessed silicon layer 206 (step 408). The second silicon layer 232 corresponding with the first GAA FET 202 and the second silicon layer 232 corresponding with the second GAA FET 204 can be recessed in the Y-direction for the first inner spacer 242 and the second inner spacer 244 to be inserted, respectively. The first inner spacer 242 and the second inner spacer 244 can be substantially rectangular shaped and can be one or more of a variety of shapes and sizes. Additionally, the first inner spacer 242 and the second inner spacer 244 can be etched such that the plurality of first silicon layers 230 and the second silicon layer 232 include a continuous profile (e.g., in the X-direction and/or the Y-direction).

Figure 18:
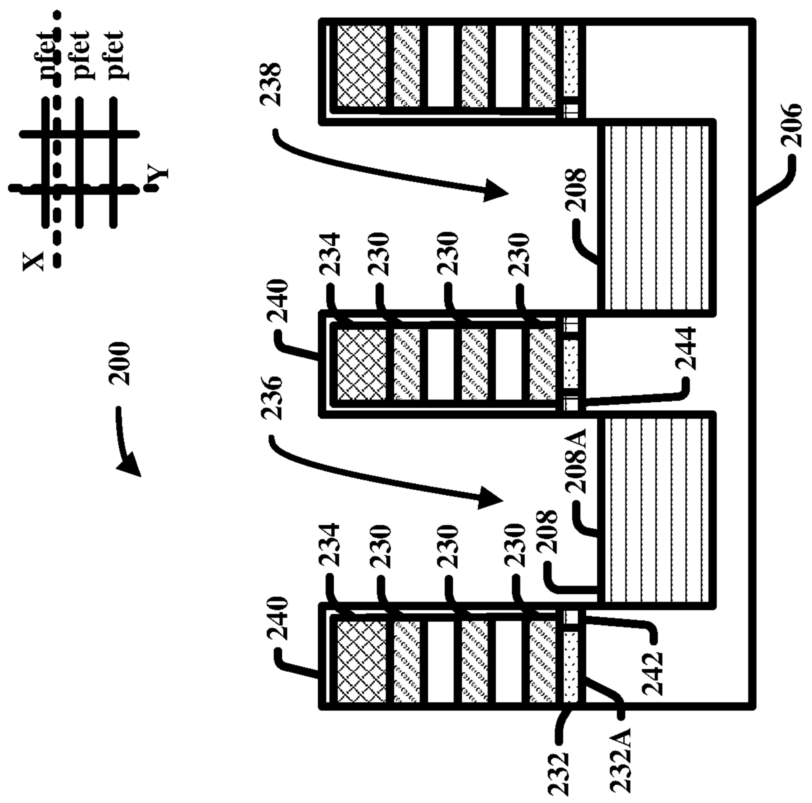
FIG. 18 illustrates a cross-sectional view of an example, non-limiting semiconductor device comprising a bulk-oxide fill to form the isolation layer, in accordance with one or more embodiments described herein.
Figure 17:
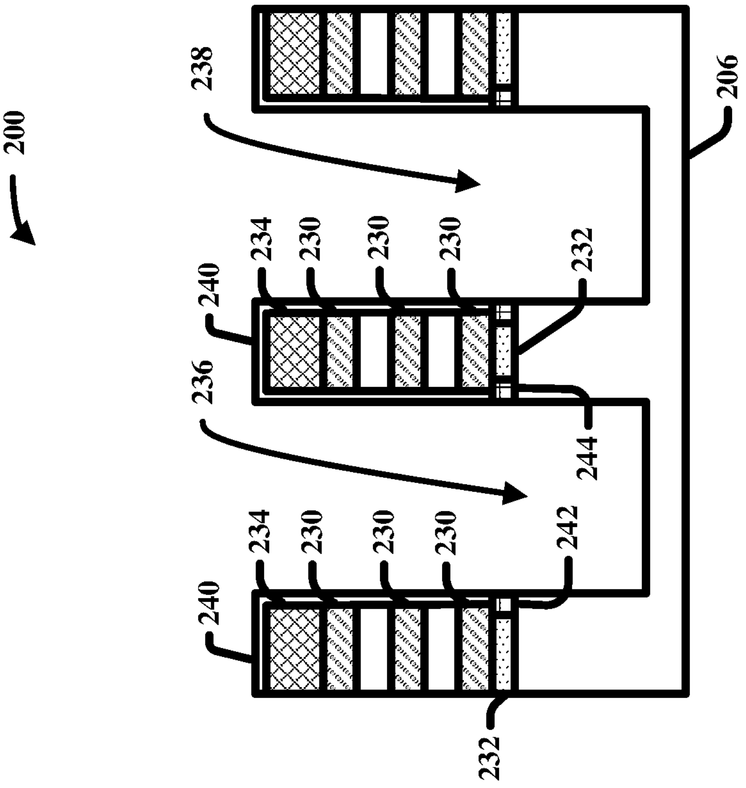
FIG. 17 illustrates a cross-sectional view of an example, non-limiting semiconductor device comprising one or more recesses for one or more isolation layers, in accordance with one or more embodiments described herein.

In embodiments, such as illustrated in FIG. 17, the method 400 of fabricating the semiconductor device 200, by the fabrication system, can comprise further recessing the semiconductor device 200 via RIE (step 410). The fabrication system can further recess at 410 the first recess 236 and the second recess 238 to form the isolation layer 208 (as shown in FIG. 18). Further, turning to FIG. 18, the method 400 of fabricating the semiconductor device 200 by the fabrication system can comprise partially filling the first recess 236 and the second recess 238 with a bulk-oxide fill to form the isolation layer 208 (e.g., a multi-layer STI region) (step 410 continued). The first recess 236 and the second recess 238 can be formed such that the top surface 208A of the isolation layer 208 is disposed below (e.g., in the Z-direction) the bottom 232A of the second silicon layer 232 (e.g., the first BDI layer 210 and the second BDI layer 212), thus exposing the silicon layer 206 to unintended electrical connections with the gate structure 224.

Figure 19:
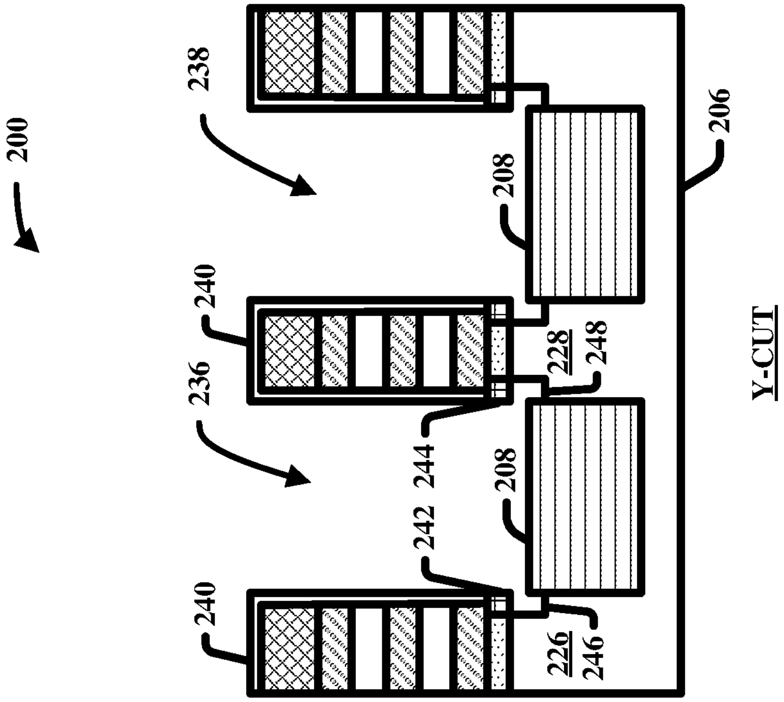
FIG. 19 illustrates a cross-sectional view of an example, non-limiting semiconductor device comprising a third recess and a fourth recess in the silicon layer, in accordance with one or more embodiments described herein.

With embodiments, such as illustrated in FIG. 19, the method 400 of fabricating the semiconductor device 200 by the fabrication system can comprise forming a third recess 246 and a fourth recess 248 in the silicon layer 206 (step 412) via directional RIE. For example and without limitation, the third recess 246 can be formed in the first sidewall 226 of the silicon layer 206 and the fourth recess 248 can be formed in the second sidewall 228 of the silicon layer 206. The fabrication system can recess the first sidewall 226 and the second sidewall 228 in one or more directions. For example, the fabrication system can recess the first sidewall 226 and the second sidewall 228 in the Y-direction (e.g., laterally) and the Z-direction. The third recess 246 and the fourth recess 248 can include one or more of a variety of shapes and sizes. For example, the third recess 246 and the fourth recess 248 can be substantially rectangular shaped, as shown in FIG. 19.

Figure 20:
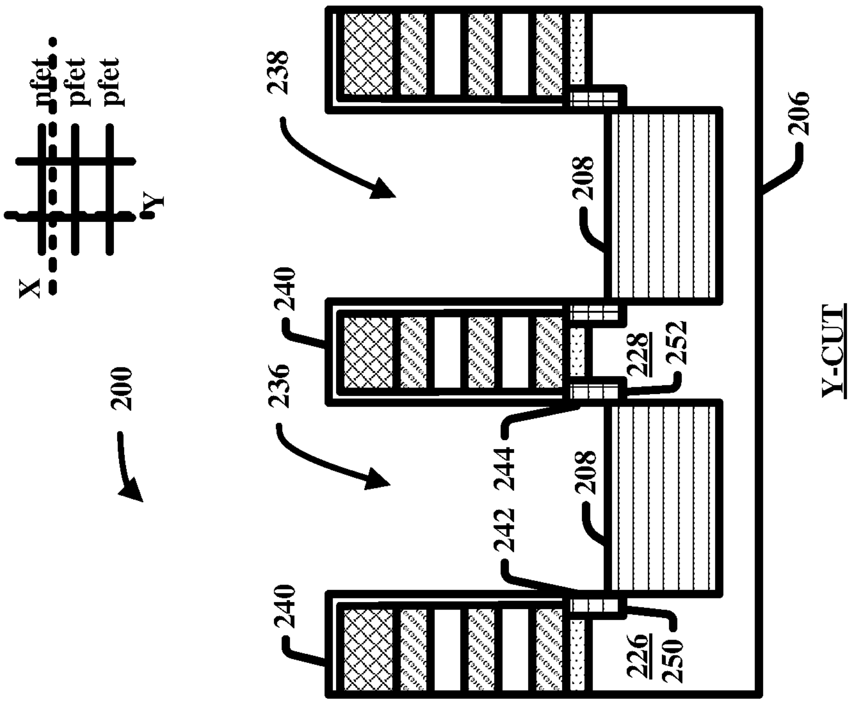
FIG. 20 illustrates a cross-sectional view of an example, non-limiting semiconductor device comprising a third inner spacer and a fourth inner spacer, in accordance with one or more embodiments described herein.

In embodiments, such as illustrated in FIG. 20, the method 400 of fabricating the semiconductor device 200 by the fabrication system can comprise depositing a third inner spacer 250 at least partially within the third recess 246 and depositing a fourth inner spacer 252 at least partially within the fourth recess 248 (step 414). The third inner spacer 250 and the fourth inner spacer 252 can pinch off the silicon layer 206 exposed by the third recess 246 and the fourth recess 248, respectively. Additionally, the third inner spacer 250 can be etched at 414 such that the plurality of first silicon layers 230, the second silicon layer 232, the first inner spacer 242, and the third inner spacer 250 include a continuous profile (e.g., in the X-direction and/or the Y-direction). The fourth inner spacer 252 can be etched such that the plurality of first silicon layers 230, the second silicon layer 232, the second inner spacer 244, and the fourth inner spacer 252 include a continuous profile (e.g., in the X-direction and/or the Y-direction). Further, the first inner spacer 242 and the third inner spacer 250 can effectively form an isolation barrier to limit electrical coupling between the gate structure 224, the silicon layer 206, and the first BDI layer 210. The second inner spacer 244 and the fourth inner spacer 252 can effectively form another isolation barrier to limit electrical coupling between the gate structure 224, the silicon layer 206, and the second BDI layer 212.

Figure 21:
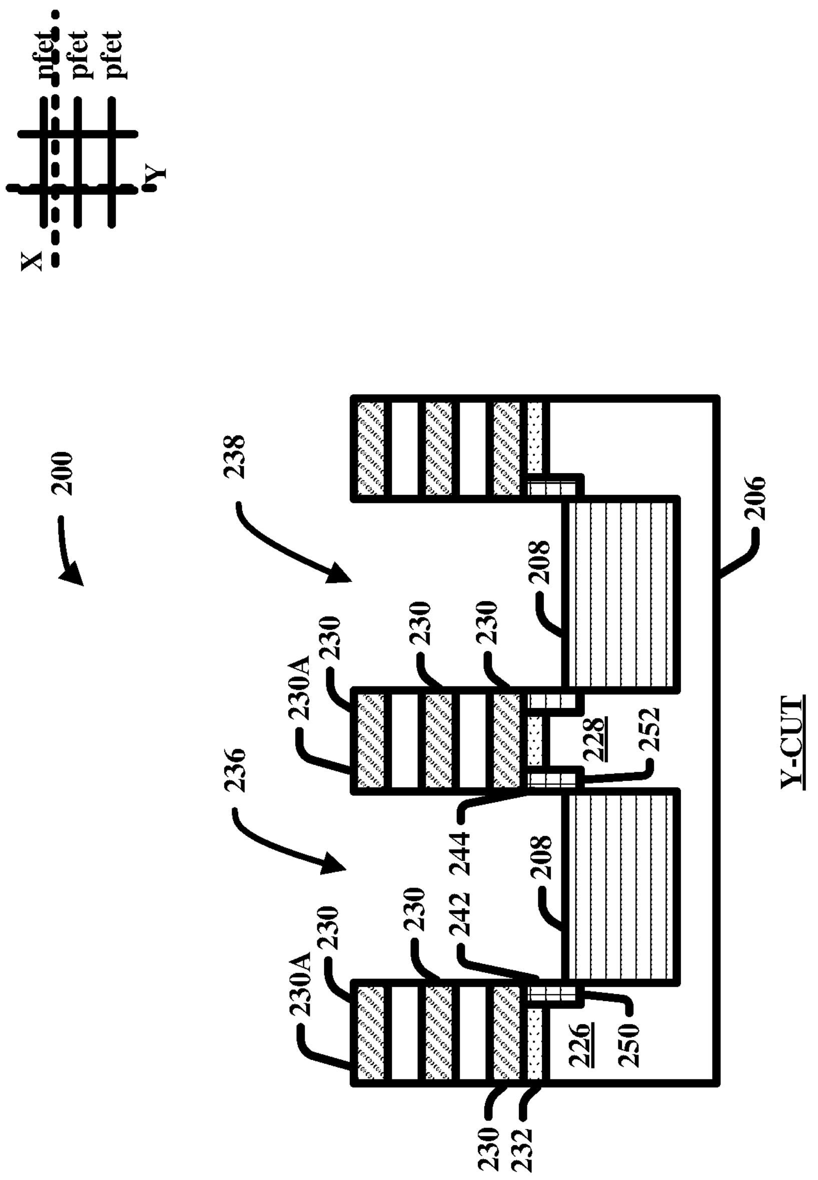
FIG. 21 illustrates a cross-sectional view of an example, non-limiting semiconductor device comprising exposed top surfaces of one or more silicon layers, in accordance with one or more embodiments described herein.

With embodiments, such as illustrated in FIG. 21, the method 400 of fabricating the semiconductor device 200 by the fabrication system can comprise removing the dielectric layer 240 and the one or more hard mask layers 234 of the semiconductor device 200. The resulting semiconductor device 200 structure can include exposed top surfaces 230A of the one or more first silicon layers 230.

Figure 22A:
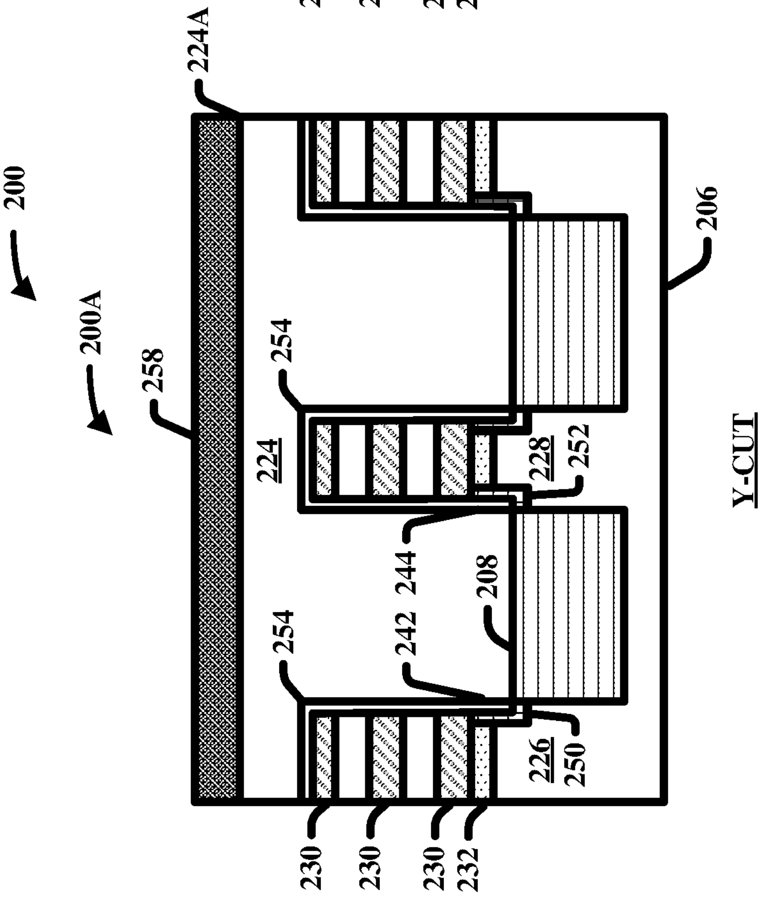
FIGS. 22A and 22B illustrate cross-sectional views of an example, non-limiting semiconductor device comprising a gate structure and hard mask layer, in accordance with one or more embodiments described herein.
Figure 22B:
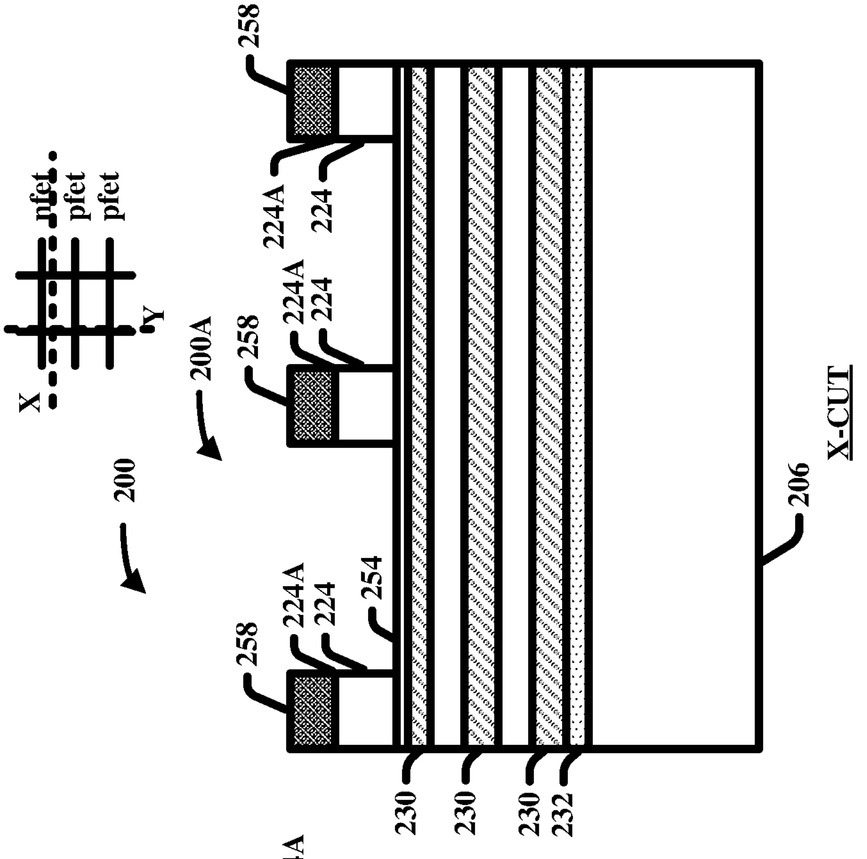

In embodiments, such as illustrated in FIGS. 22A and 22B, the method 400 of fabricating the semiconductor device 200 by the fabrication system can comprise depositing an EG oxide layer 254 on the top surface 200A of the semiconductor device 200 (e.g., along an exterior surface of the plurality of first silicon layers 230), depositing the gate structure 224 and depositing a second hard mask layer 258 on the top surface 224A of the gate structure 224. Further, the gate structure 224 can be deposited directly on the EG oxide layer 254. The gate structure 224 can fill the remainder of the first recess 236 and the second recess 238 apart from the isolation layer 208.

Figures 23A, 23B, 23C:
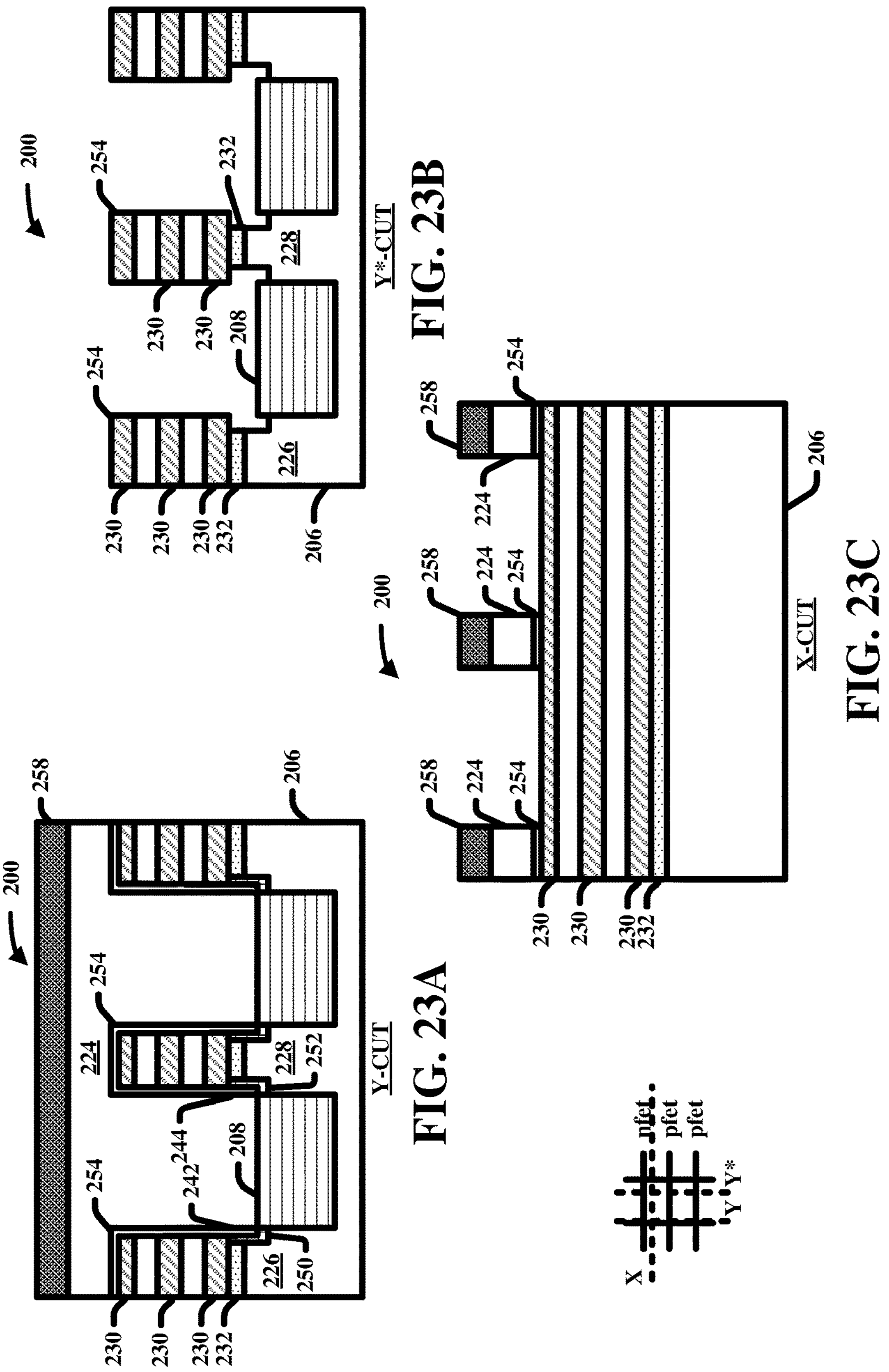
FIGS. 23A, 23B, and 23C illustrate various cross-sectional view of an example, non-limiting semiconductor device comprising the step of removing portions of the EG oxide layer and portions of the one or more inner spacers, in accordance with one or more embodiments described herein.

With embodiments, such as illustrated in FIGS. 23A, 23B, and 23C, the method 400 of fabricating the semiconductor device 200 by the fabrication system can comprise removing portions of the EG oxide layer 254 and removing portions of the first inner spacer 242, the second inner spacer 244, the third inner spacer 250, and the fourth inner spacer 252 (step 416). Further, portions of the inner spacers 242, 244, 250, 252 substantially proximate the isolation layer 208 can be removed in areas where the isolation layer 208 is not in contact with gate structure 224 (as demonstrated by Y-Cut and Y*-Cut section views as FIGS. 23A and 23B, respectively). Residual portions of the first inner spacer 242, the second inner spacer 244, the third inner spacer 250, and the fourth inner spacer 252 can remain within the silicon layer 206.

Figures 24A, 24B, 24C:
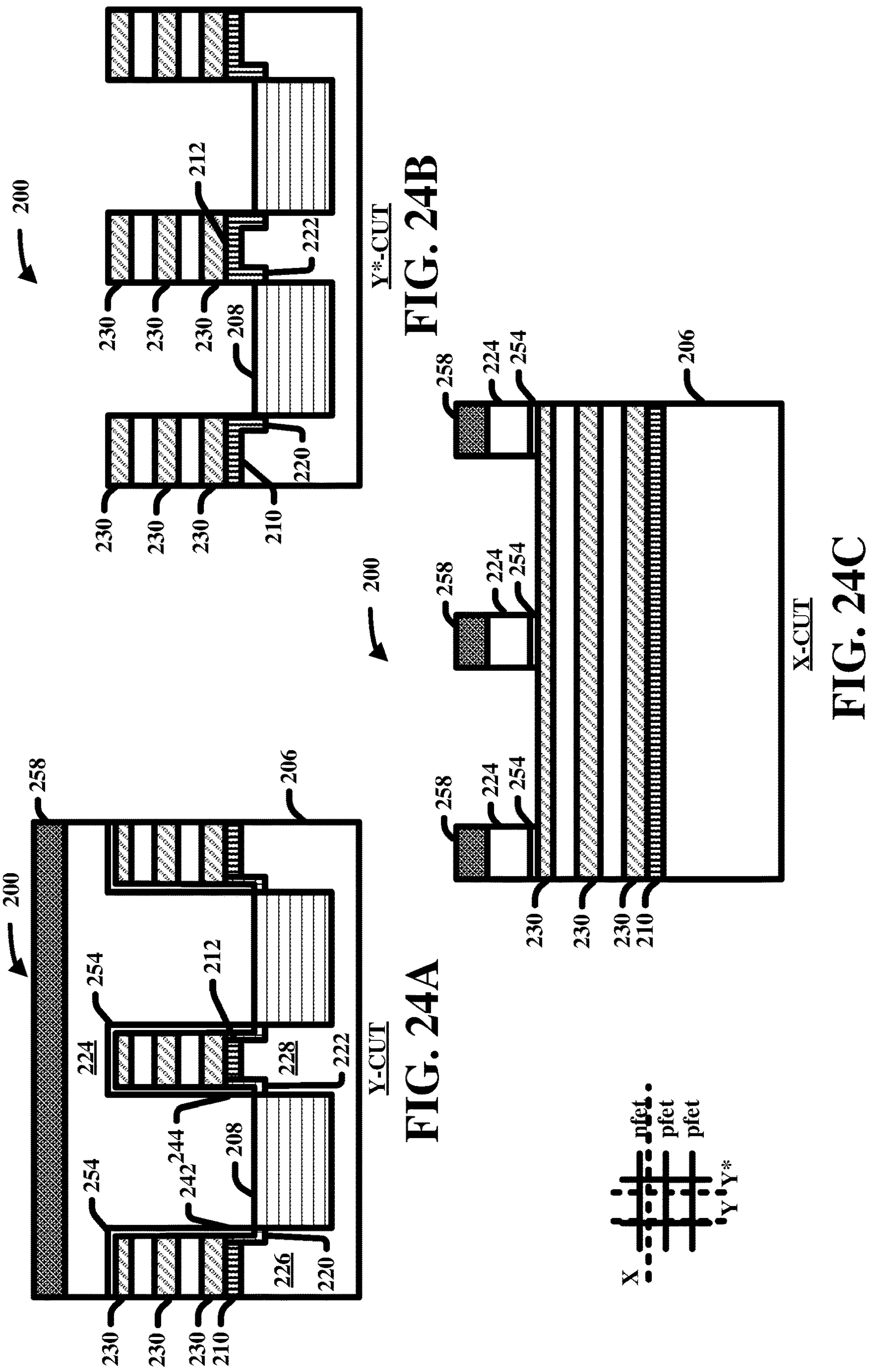
FIGS. 24A. 24B, and 24C illustrate cross-sectional views of another example, non-limiting semiconductor device comprising a first BDI layer and a second BDI layer formed by removing one or more silicon layers, in accordance with one or more embodiments described herein.
Figure 25:
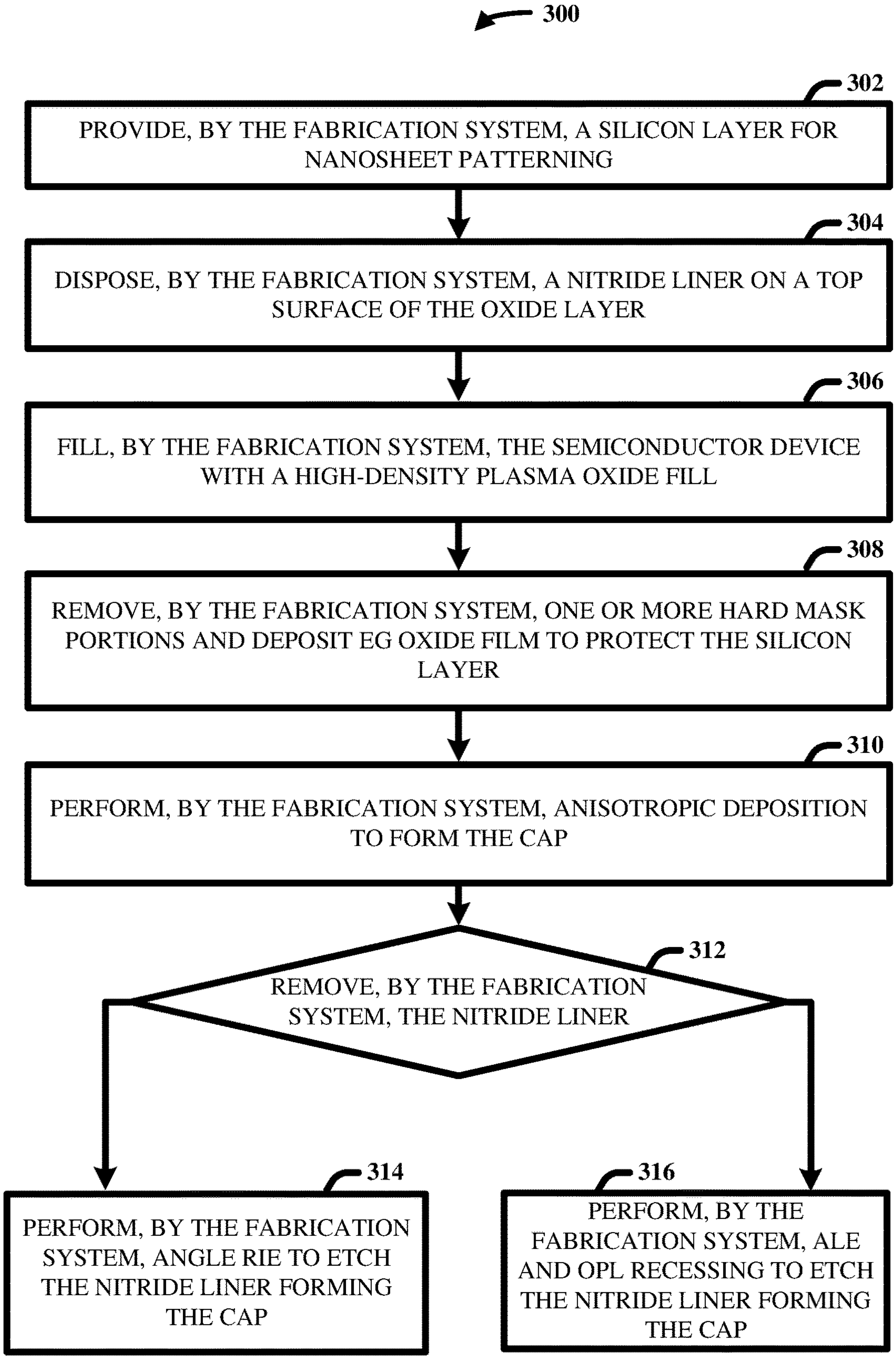
FIG. 25 illustrates a flow diagram of an example, non-limiting method for fabricating a semiconductor device, in accordance with one or more embodiments described herein.
Figure 26:
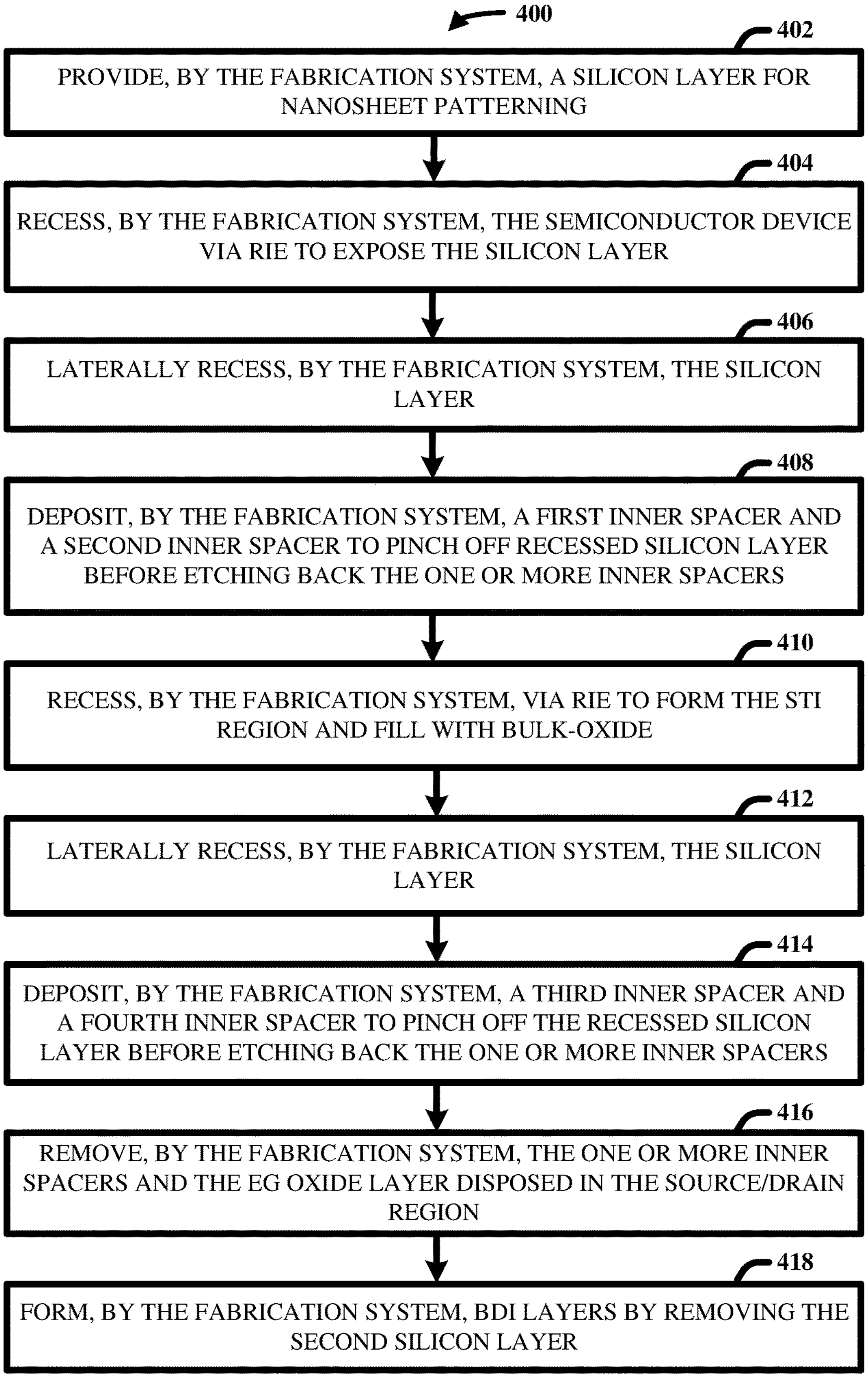
FIG. 26 illustrates a flow diagram of an example, non-limiting method for fabricating a semiconductor device, in accordance with one or more embodiments described herein.

In embodiments, such as generally illustrated in FIGS. 24A, 24B, and 24C, the method 400 of fabricating the semiconductor device 200 by the fabrication system can comprise removing the second silicon layer 232 (e.g., removing SiGe 55% from the semiconductor device); whereby, removing the second silicon layer 232 can facilitate forming the first BDI layer 210 and the second BDI layer 212 (step 418). Further, the first BDI layer 210 and the second BDI layer 212 can be formed via one or more Atomic Layer Deposition and Atomic Layer Etching processes. The fabrication system can facilitate forming the first sidewall spacer 220 and the second sidewall spacer 222 to limit electrical connection between the gate structure 224 and the silicon layer 206 (e.g., in the source/drain region of the semiconductor device 200). Further, the first sidewall spacer 220 and the second sidewall spacer 222 can connect the isolation layer 208 to the first BDI layer 210 and the second BDI layer 212.

With embodiments, the first sidewall spacer 220 and the second sidewall spacer 222 can be one or more of a variety of materials. For example and without limitation, in the source/drain region of the semiconductor device 200 (as shown in FIG. 24B), the first sidewall spacer 220 and the second sidewall spacer 222 can be the same material (e.g., substantially the same material) as the first BDI layer 210 and the second BDI layer 212. Additionally, the first sidewall spacer 220 and the second sidewall spacer 222 can include different materials in the source/drain region (e.g., as shown in FIG. 24B) in comparison to the gate structure 224 (e.g., as shown in FIG. 24A). In examples, the first sidewall spacer 220 and the second sidewall spacer 222 can include substantially the same materials. Further, in the source/drain region, the first sidewall spacer 220 and the first BDI layer 210 can share a continuous profile (e.g., extending planarly aligned in the Y-direction). The first sidewall spacer 220 can be substantially disposed in the third recess 246 and in the recess of the silicon layer 206 previously occupied by the first inner spacer 242 (e.g., in the source/drain region of FIG. 24B) proximate the first BDI layer 210. The second sidewall spacer 222 can be substantially disposed in the fourth recess 248 and in the recess of the silicon layer 206 previously occupied by the second inner spacer 244 (e.g., in the source/drain region of FIG. 24B) proximate the second BDI layer 212.

In other embodiments, other methods (not shown) can include depositing, by a fabrication system, the nitride-based dielectric liner 122 on a patterned silicon nanosheet 106 coupled to a first GAA FET 102 and a second GAA FET 104. The method can further include filling, by the fabrication system, the patterned silicon nanosheet 106 with a first oxide layer (e.g., an isolation layer 108) to be in contact with the nitride-based dielectric liner 122. Additionally, the method can include recessing, by the fabrication system, the first oxide layer (e.g., the isolation layer 108) to be vertically aligned with a first BDI layer 110 of the first GAA FET 102 and a second BDI layer 112 of the second GAA FET 104. The method can include recessing, by the fabrication system, the nitride-based dielectric liner 122 from contacting the first GAA FET 102 and the second GAA FET 104. Further, the method can include depositing, by the fabrication system, a second oxide layer (e.g., the EG oxide layer 154). The method can include depositing, by the fabrication system, a cap 120 between the first GAA FET 102 and the second GAA FET 104 to isolate a gate structure 124 of the first GAA FET 102 and the second GAA FET 104 from contacting the patterned silicon nanosheet 106.

In other embodiments, other methods (not shown) can include disposing, by the fabrication system, a dielectric layer 240 on a patterned nanosheet 206 comprising a GAA FET 202 and a silicon base layer. The method can also comprise recessing, by the fabrication system, a silicon layer 232 of the GAA FET 202 in a lateral direction and disposing a first portion of a sidewall spacer (e.g., the first inner spacer 242) therein. The method can include recessing, by the fabrication system, the silicon base layer 206 and disposing an isolation layer 208 therein. Further, the method can include recessing, by the fabrication system, the silicon base layer 206 in the lateral direction and disposing a second portion of the sidewall spacer (e.g., the third inner spacer 250) therein. Additionally, the method can comprise etching, by the fabrication system, the first portion and the second portion of the sidewall spacer to form a continuous vertical surface with the GAA FET 202.

In embodiments, the method can comprise removing, by the fabrication system, the first portion and the second portion of the sidewall spacer in a source/drain region and an oxide layer 254 in the source/drain region proximate the isolation layer 208. The method can include removing, by the fabrication system, the silicon layer 232 of the GAA FET 202; and depositing, by the fabrication system, a BDI layer 210 of the GAA FET 202 via Atomic Layer Deposition (ALD), wherein the first portion and the second portion of the sidewall spacer can limit electrical contact between a gate structure 224 of the GAA FET 202 and the silicon base layer 206.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A semiconductor device comprising:

a first Gate-All-Around (GAA) field-effect transistor (FET) disposed on a silicon layer;

a second GAA FET disposed on the silicon layer adjacent to the first GAA FET;

an isolation layer disposed within the silicon layer between a first bottom dielectric isolation (BDI) layer of the first GAA FET and a second BDI layer of the second GAA FET; and a gate structure disposed over the first GAA FET and the second GAA FET, wherein at least one of:

(i) a cap comprising a nitride-based dielectric material is disposed vertically between the isolation layer and at least one of the first BDI layer or the second BDI layer, or (ii) a sidewall spacer is in direct contact with the isolation layer and at least one of the first BDI layer or the second BDI layer, such that the cap or the sidewall spacer isolates the gate structure from the silicon layer.

2. The semiconductor device of claim 1, wherein the cap is disposed continuously between the isolation layer and both the first BDI layer of and the second BDI layer.

3. The semiconductor device of claim 2, wherein the at least one of the cap or the sidewall spacer comprises a nitride-based dielectric material.

4. The semiconductor device of claim 2, wherein the gate structure is electrically isolated from the silicon layer by the cap.

5. The semiconductor device of claim 2, wherein the gate structure is at least partially electrically isolated from the silicon layer by the sidewall spacer.

6. The semiconductor device of claim 4, wherein the cap is in direct contact with an oxide layer.

7. The semiconductor device of claim 6, wherein the oxide layer is disposed vertically between the cap and the isolation layer.

8. The semiconductor device of claim 7, wherein the oxide layer is in contact with a nitride-based dielectric liner.

9. The semiconductor device of claim 8, wherein the oxide layer is in contact with an outer surface of the silicon layer, and wherein the cap together with the nitride-based dielectric liner laterally surrounds at least a portion of the isolation layer to electrically isolate the gate structure from the silicon layer and mitigate over-etching during fabrication.

10. The semiconductor device of claim 9, wherein the cap is formed via an anisotropic deposition of Silicon nitride (SiN).

11. The semiconductor device of claim 5, wherein the sidewall spacer is in contact with at least one of the first BDI layer or the second BDI layer; and the sidewall spacer is in contact with the isolation layer.

12. The semiconductor device of claim 11, wherein a first surface of the sidewall spacer is opposite to a second surface of the sidewall spacer; and the first surface of the sidewall spacer is vertically aligned with a first surface of the first BDI layer.

13. The semiconductor device of claim 12, including a source/drain region, wherein the sidewall spacer comprises a first material in the source/drain region; the sidewall spacer comprises a second material in the gate structure; and the first material is different than the second material.

14. The semiconductor device of claim 13, wherein the first BDI layer includes a third material; and the third material is substantially the same as the first material in the source/drain region.

* * * * *